US006696317B1

(12) United States Patent
Honda

(10) Patent No.: US 6,696,317 B1
(45) Date of Patent: Feb. 24, 2004

(54) METHOD OF MANUFACTURING A FLIP-CHIP SEMICONDUCTOR DEVICE WITH A STRESS-ABSORBING LAYER MADE OF THERMOSETTING RESIN

(75) Inventor: Hirokazu Honda, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 94 days.

(21) Appl. No.: 09/704,521

(22) Filed: Nov. 3, 2000

(30) Foreign Application Priority Data

Nov. 4, 1999 (JP) .................................. 11-313684

(51) Int. Cl.[7] .................. H01L 21/44; H01L 21/48; H01L 21/50

(52) U.S. Cl. ................................................ 438/108

(58) Field of Search .................. 438/108, 613, 438/637

(56) References Cited

U.S. PATENT DOCUMENTS

| 5,074,947 A | 12/1991 | Estes et al. | |
|---|---|---|---|
| 5,237,130 A | 8/1993 | Kulesza et al. | |
| 5,677,576 A | 10/1997 | Akagawa | |
| 5,682,061 A | 10/1997 | Khandros et al. | |
| 5,683,942 A | 11/1997 | Kata et al. | 437/209 |
| 5,736,790 A | 4/1998 | Iyogi et al. | |
| 5,977,641 A | 11/1999 | Takahashi et al. | |
| 5,998,861 A | 12/1999 | Hiruta | 257/700 |
| 6,153,448 A | 11/2000 | Takahashi et al. | |
| 6,344,696 B2 | 2/2002 | Nakamura et al. | |
| 2001/0004134 A1 | 6/2001 | Saitoh | |
| 2001/0013425 A1 | 8/2001 | Rokugawa et al. | |
| 2001/0018986 A1 | 9/2001 | Nagai et al. | |
| 2001/0035586 A1 | 11/2001 | Nakamura et al. | |
| 2002/0068383 A1 | 6/2002 | Nakamura et al. | |

FOREIGN PATENT DOCUMENTS

| EP | 11-111896 | 4/1999 |
|---|---|---|
| EP | 1043922 A1 | 10/2000 |
| EP | 1 128 431 A2 | 8/2001 |
| JP | 3-119737 | 5/1991 |
| JP | 5-503191 | 5/1993 |
| JP | 5-275489 | 10/1993 |
| JP | 06-302604 | 10/1994 |
| JP | 8-37253 | 2/1996 |
| JP | 08-330313 | 12/1996 |
| JP | 8-330355 | 12/1996 |
| JP | 09-092685 | 4/1997 |
| JP | 9-148334 | 6/1997 |
| JP | 10-303327 | 11/1998 |
| JP | 10-313074 | 11/1998 |
| JP | 11-040613 | 2/1999 |
| JP | 11-074309 | 3/1999 |
| JP | 11-097578 | 4/1999 |
| JP | 11-224885 | 8/1999 |

(List continued on next page.)

OTHER PUBLICATIONS

Amami et al., "Advanced MCM–Ls for Consumer Electronics", IEMT/IMC Proceeding, pp. 249–254 Matsushita Electric Industrial Co., Ltd., 1998.

Koji Matsui t al, Resin and Flexible Metal Bumps for Chip–on–Glass Technology, Electronic Components and Technology Conf. 1993 Proceedings, 43rd, 1993, 1993 IEEE, Material Development Center, Color LCD Division, NEC Corporation.

Primary Examiner—Richard Elms
Assistant Examiner—Beth E. Owens
(74) Attorney, Agent, or Firm—Foley & Lardner

(57) ABSTRACT

In a flip-chip type semiconductor device, a plurality of pad electrodes are formed on a semiconductor substrate. An insulating stress-absorbing resin layer made of thermosetting resin is adhered to the substrate as a composite layer in conjunction with a first conductive layer and has openings corresponding to the pad electrodes. A plurality of metal bumps are formed on the conductive layer.

7 Claims, 37 Drawing Sheets

FOREIGN PATENT DOCUMENTS

| | | |
|---|---|---|
| JP | 2000-174052 | 6/2000 |
| JP | 2000-269256 | 9/2000 |
| JP | 2000-349197 | 12/2000 |
| JP | 2001-24021 | 1/2001 |
| JP | 2001-028379 | 1/2001 |
| WO | WO 98/25297 A1 | 6/1998 |
| WO | WO 99/17352 A1 | 4/1999 |
| WO | WO 99/18609 | 4/1999 |

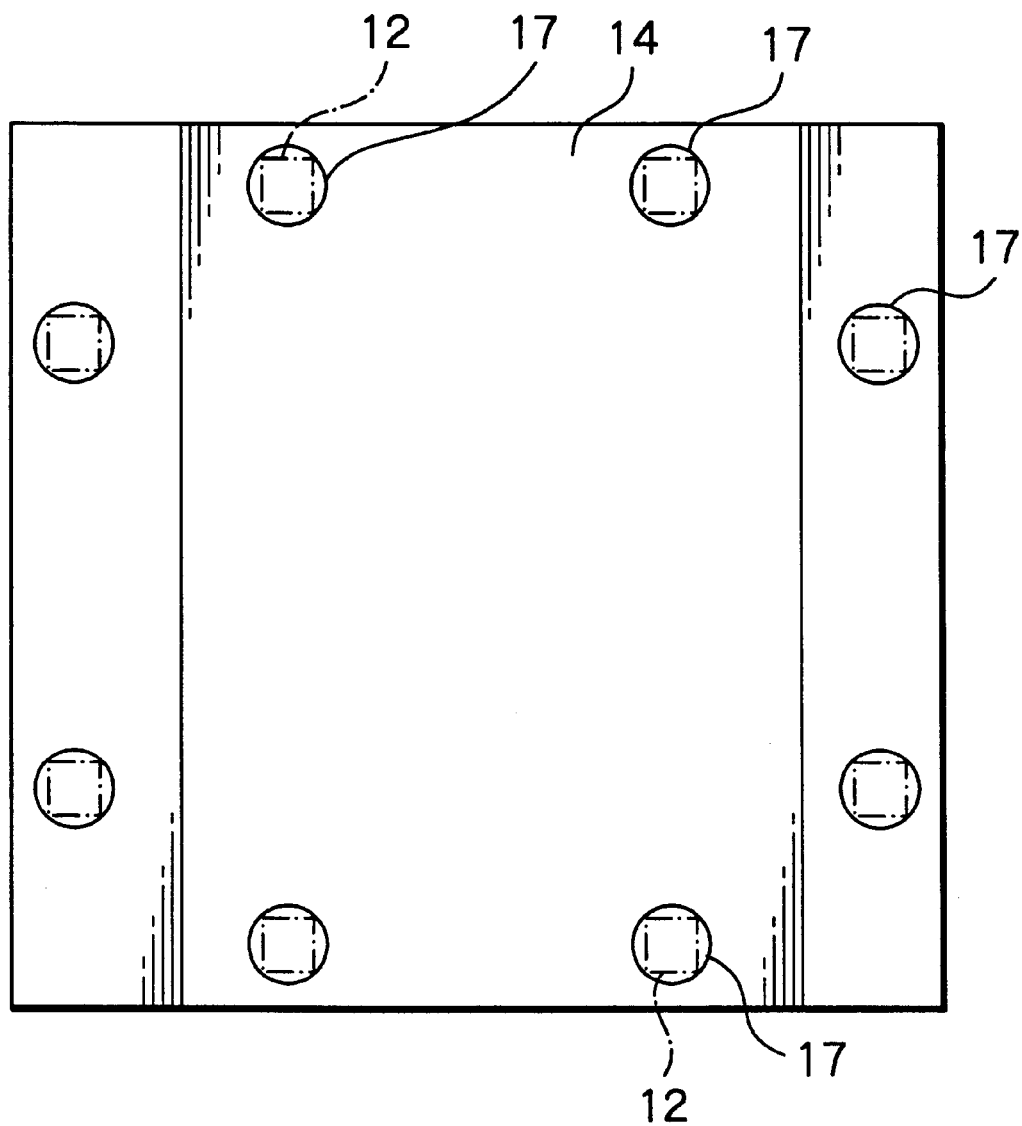

METHOD OF MANUFACTURING A FLIP-CHIP SEMICONDUCTOR DEVICE WITH A STRESS-ABSORBING LAYER MADE OF THERMOSETTING RESIN

BACKGROUND OF THE INVENTION

1. Field of the Invention

The present invention relates to a flip-chip type semiconductor device and its manufacturing method, and more particularly, to the improvement of reducing stress strain within the flip-chip type semiconductor device.

2. Description of the Related Art

Recently, flip-chip type semiconductor devices have been developed to meet the requirements of higher performance, smaller and lighter size and higher speed for electronic equipment.

Generally, a flip-chip type semiconductor device having metal bumps is directly mounted on a motherboard having electrodes corresponding to the metal bumps. That is, if the metal bumps are solder balls, the solder balls are reflown and soldered on the motherboard. In this case, a stress strain occurs due to the discrepancy in thermal expansion coefficient between the semiconductor device and the motherboard, which would deteriorate the reliability characteristics of the semiconductor device. This will be explained later in detail.

In order to minimize the above-mentioned discrepancy in thermal expansion coefficient, the motherboard is made of ceramic material such as aluminum nitride (AlN), mullite or glass ceramics, which have a thermal expansion coefficient close to that of silicon. In this case, however, the motherboard becomes more expensive, and therefore, its application is limited to high-priced equipment such as a super computer and a large scale computer.

On the other hand, in order to disperse shearing stress occurring at the metal bumps to substantially reduce the above-mentioned stress strain, under-fill resin is inserted between the semiconductor device and the motherboard (see JP-A-9-92685). In this case, however, if voids may be generated within the under-fill resin or if the adhesive characteristics between the under-fill resin and the semiconductor device (or the motherboard) deteriorate, the semiconductor device would be separated from the motherboard.

In other approaches to disperse shearing stress occurring at the metal bumps to substantially reduce the above-mentioned stress strain, an elastic layer made of rubber or expandable styrene is provided on the semiconductor device (see JP-A-11-40613, JP-A-11-74309). This also will be explained later in detail.

In the above-mentioned approaches, however, since the elastic layer includes much contamination, the reliability of the semiconductor device would deteriorate.

SUMMARY OF THE INVENTION

It is an object of the present invention to provide a reliable flip-chip type semiconductor device and its manufacturing method.

According to the present invention, in a flip-chip type semiconductor device, a plurality of pad electrodes are formed on a semiconductor substrate. An insulating stress-absorbing resin layer made of thermosetting resin is formed on the semiconductor substrate and has openings corresponding to the pad electrodes. A plurality of flexible conductive members are filled in the openings. A plurality of metal bumps are formed on the flexible conductive layers. Since the thermosetting resin has little contamination, the reliability of the flip-chip type semiconductor device would be improved.

BRIEF DESCRIPTION OF THE DRAWINGS

The present invention will be more clearly understood from the description set forth below, as compared with the prior art, with reference to the accompanying drawings, wherein:

FIG. 3 is a plan view of one flip-chip type semiconductor device obtained by the method as illustrated in FIGS. 2A through 2J;

DESCRIPTION OF THE PREFERRED EMBODIMENTS

Before the description of the preferred embodiments, prior art flip-chip type semiconductor devices will be explained with reference to FIGS. 1A, 1B and 1C.

Figure 1A:
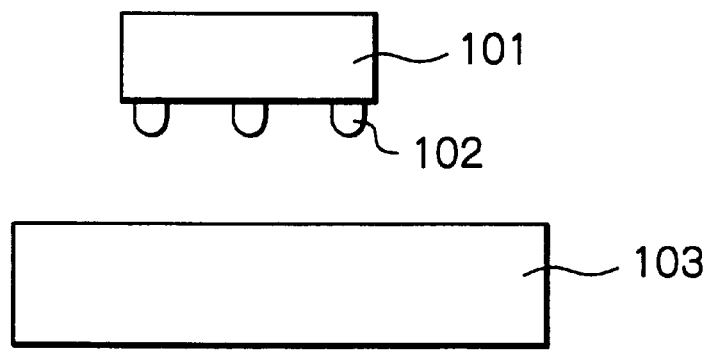
FIGS. 1A, 1B and 1C are views for explaining a prior art method for mounting a flip-chip type semiconductor device on a motherboard.
Figure 1B:
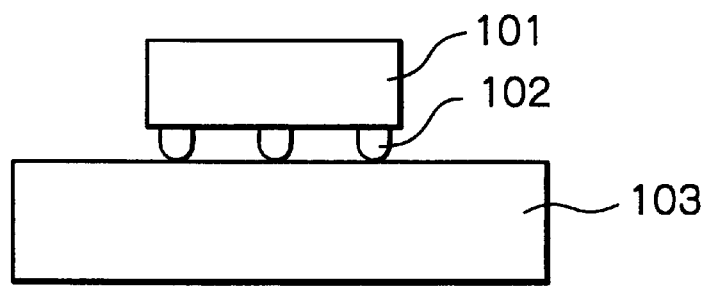
Figure 1C:
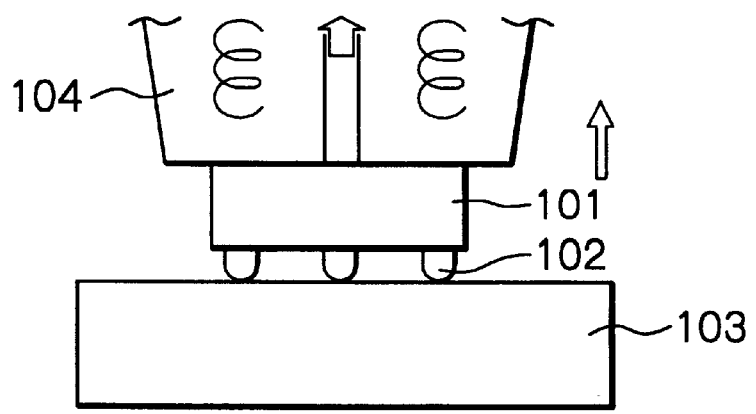

FIGS. 1A, 1B and 1C are views for explaining a prior art method for mounting a flip-chip type semiconductor device on a motherboard.

First referring to FIG. 1A, a flip-chip type semiconductor device 101 having metal bumps 102 and a motherboard 103 having electrodes (not shown) corresponding to the metal bumps 102 are prepared. Note that the motherboard 103 is prepared by a user.

Next, referring to FIG. 1B, the flip-chip type semiconductor device 101 is mounted on the motherboard 103. Note that, if the metal bumps 102 are solder balls, the solder balls are reflown at a temperature below a predetermined temperature and soldered on the motherboard 103. In this case, a stress strain occurs due to the discrepancy in thermal expansion coefficient between the semiconductor device 101 and the motherboard 103, which would deteriorate the reliability characteristics of the semiconductor device 101.

In order to minimize the discrepancy in thermal expansion coefficient between the semiconductor device 101 and the motherboard 103, the motherboard 103 may be made of ceramic material such as aluminum nitride (AlN), mullite or glass ceramics, which have a thermal expansion coefficient close to that of silicon. In this case, however, the motherboard 103 becomes more expensive, and therefore, its application is limited to high-priced equipment such as a super computer and a large scale computer.

On the other hand, in order to disperse shearing stress occurring at the metal bumps 102 to substantially reduce the above-mentioned stress strain, under-fill resin is inserted between the semiconductor device 101 and the motherboard 103 (see JP-A-9-92685). In JP-A-9-92685, note that under-fill is inserted between a flip-chip type semiconductor device and an interposer substrate. In this case, however, if voids may be generated within the under-fill resin or if the adhesive characteristics between the under-fill resin and the semiconductor device 101 (or the motherboard 103) deteriorate, the semiconductor device 101 would be separated from the motherboard 103.

In other approaches to disperse shearing stress occurring at the metal bumps 102 to substantially reduce the above-mentioned stress strain, an elastic layer made of rubber or expandable styrene is provided on the semiconductor device (see JP-A-11-40613, JP-A-11-74309).

In the state as illustrated in FIG. 1B, if an open state or a short-circuit state is generated by a defective soldering process, the semiconductor device 101 is separated and detached by a special heating tool 104 as illustrated in FIG. 1C. In this case, the metal bumps 102 are damaged. Therefore, the metal bumps 102 are repaired, and the semiconductor device 101 can be reused.

However, in a case where under-fill resin is used, the semiconductor device 101 per se may be damaged, so that it is impossible to reuse the semiconductor device 101. Additionally, the motherboard 103 may also be damaged.

Further, in a case where an elastic layer is made of rubber or expansible styrene, since the elastic layer includes much contamination, the reliability of the semiconductor device 101 would deteriorate.

A first embodiment of the method for manufacturing a flip-chip type semiconductor device according to the present invention will be explained next with reference to FIGS. 2A through 2J.

Figure 2A:
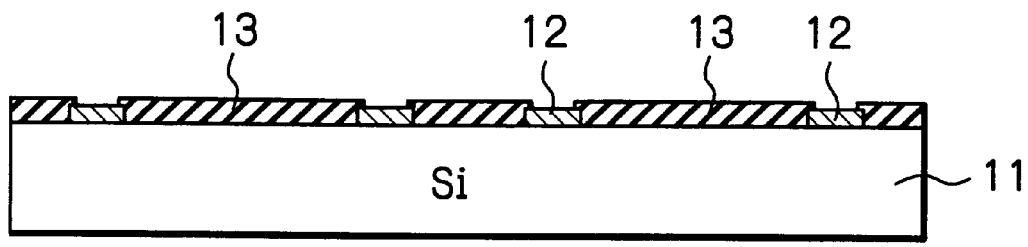
FIGS. 2A through 2J are cross-sectional views for explaining a first embodiment of the method for manufacturing a flip-chip type semiconductor device according to the present invention.

First, referring to FIG. 2A, pad electrodes 12 made of aluminum (Al) or copper (Cu) are formed on a silicon substrate 11. Then, a passivation layer 13 made of non-organic material such as silicon oxide ($SiO_2$) or organic material such as polyimide is deposited on the silicon substrate 11 to protect active areas thereof.

Figure 2B:
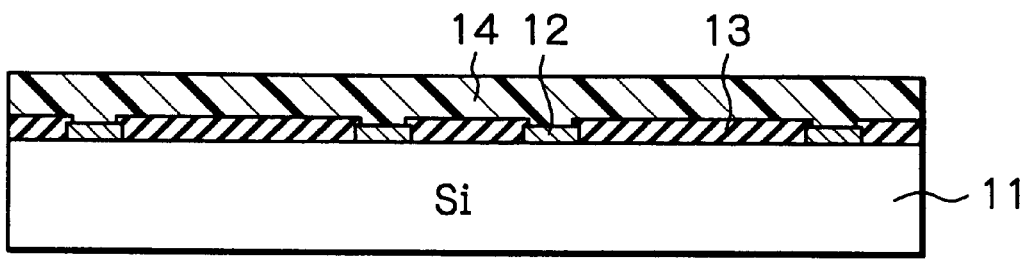

Next, referring to FIG. 2B, an insulating stress-absorbing resin layer 14 made of thermosetting resin such as epoxy resin, silicone resin, polyimide resin, polyolefin resin, cyanate-ester resin, phenol resin, naphthalene resin or fluorene resin is coated on the entire surface by a spin-coating process. Note that the modulus of elasticity of the insulating stress-absorbing resin layer 14 is approximately from 0.01 to 8 GPa.

Figure 2C:
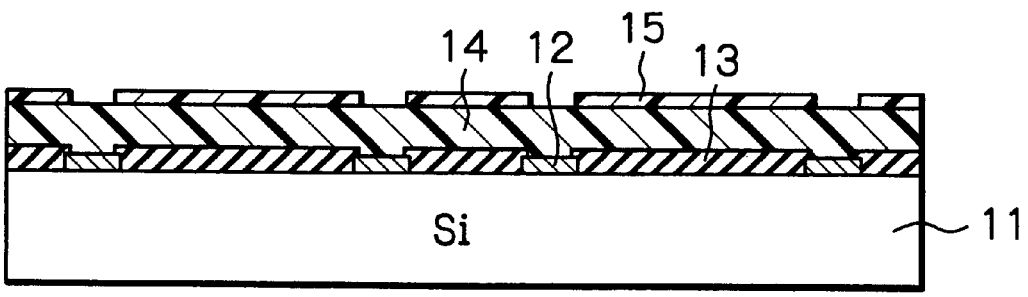

Next, referring to FIG. 2C, a photoresist layer is coated on the insulating stress-absorbing resin layer 14 and is patterned by a photolithography process to form a photoresist pattern layer 15 which has openings corresponding to the pad electrodes 12.

Figure 2D:
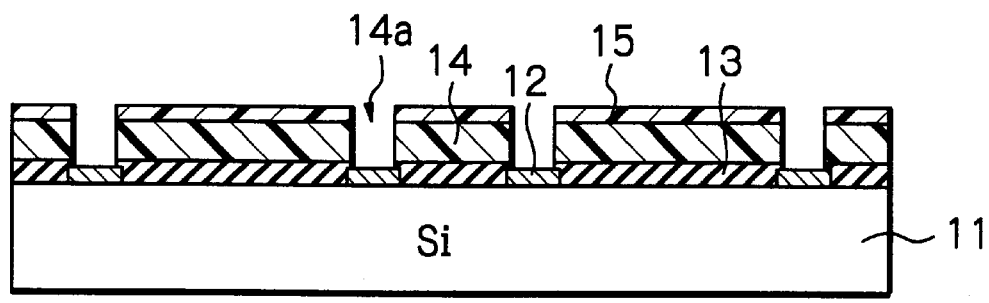

Next, referring to FIG. 2D, the insulating stress-absorbing resin layer 14 is perforated by a wet etching process, a plasma etching process or a laser process using the photoresist pattern layer 15 as a mask, to form openings 14a, thus exposing the pad electrodes 12. Note that, if the insulating stress-absorbing resin layer 14 is made of material which can be subjected to a chemical etching process, the wet etching process can be used. On the other hand, if the insulating stress-absorbing resin layer 14 is made of material which cannot be subjected to a chemical etching process, the plasma etching process or the laser process can be used.

Figure 2E:
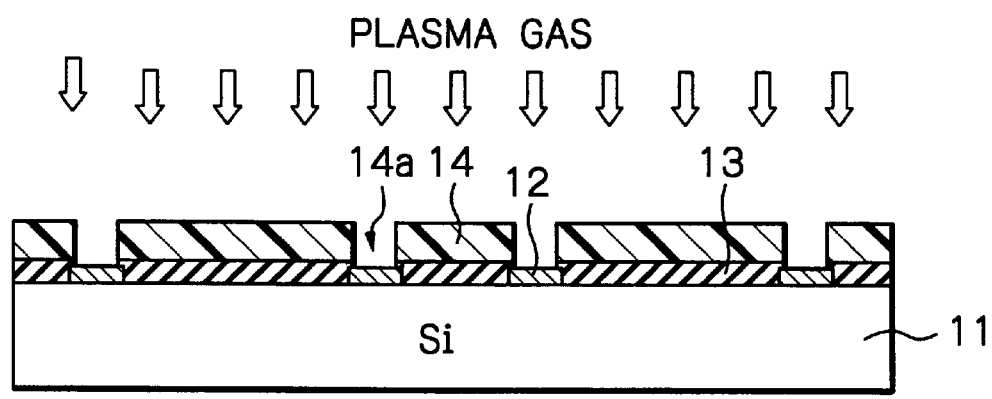

Next, referring to FIG. 2E, the photoresist pattern layer 15 is removed to expose the insulating stress-absorbing resin layer 14. Then, the device is subjected to a plasma surface treatment using inert gas such as Ar gas under a low pressure atmosphere. As a result, the remainder of the insulating stress-absorbing resin layer 14 on the pad electrodes 12 is completely removed, and also metal oxide on the surface of the pad electrodes is removed.

Figure 2F:
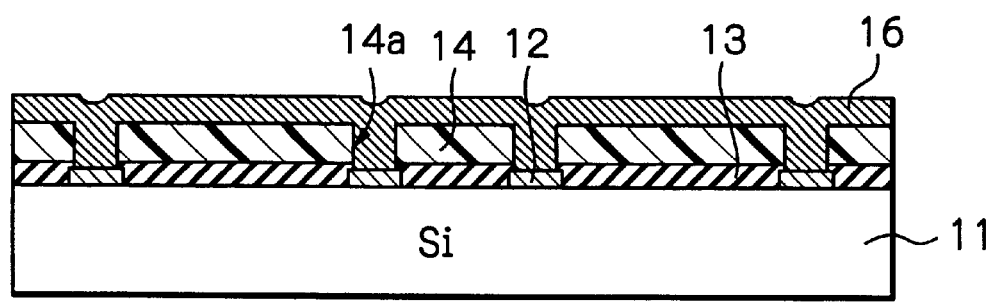

Next, referring to FIG. 2F, a flexible conductive layer 16 is coated on the insulating stress-absorbing resin layer 14 by a screen printing method or the like, so that the flexible conductive layer 16 is filled in the openings 14a, thus preventing the pad electrodes 12 from being oxidized. The flexible conductive layer 16 is made of powdered material of at least one of copper (Cu), lead (Pb), tin (Sn), nickel (Ni), palladium (Pd), silver (Ag) or gold (Au), that shows excellent solder-wettability characteristics as well as excellent flexibility characteristics.

Figure 2G:
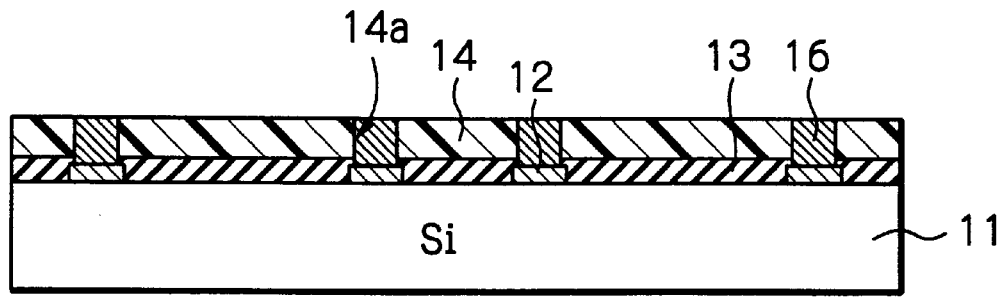

Next, referring to FIG. 2G, the flexible conductive layer 16 is flattened by a chemical mechanical polishing (CMP) process, so that the flexible conductive layer 16 is filled only in the openings 14a. In this case, a plasma surface treatment may be carried out to remove polishing waste caused by the CMP process.

Figure 2H:
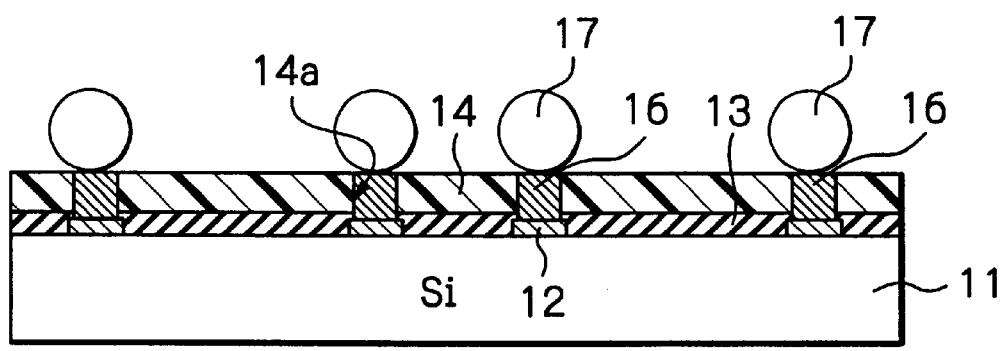

Next, referring to FIG. 2H, an electroless Cu plating process or an electroless Ni plating process is carried out to form land portions (not shown) on the pad electrodes 12. The land portions can be formed by carrying out an electroless Au plating process after an electrolytic Cu w plating process. Then, metal bumps (solder balls) 17 made of Sn and Pb are soldered to the pad electrodes 12 via the land portions. Thus, since the land portions improves the wettability of the metal bumps 17, the metal bumps 17 can be securely adhered to the pad electrodes 12.

In FIG. 2H, flux (not shown) instead of the land portions can be coated on the pad electrodes 12, and then, metal bumps 17 are soldered to the pad electrodes 12 and a heating reflowing process is performed thereupon. Even in this case, the metal bumps 17 can be securely adhered to the pad electrodes 12.

Note that the metal bumps 17 can be made of Au or Sn—Ag alloy.

Figure 2I:
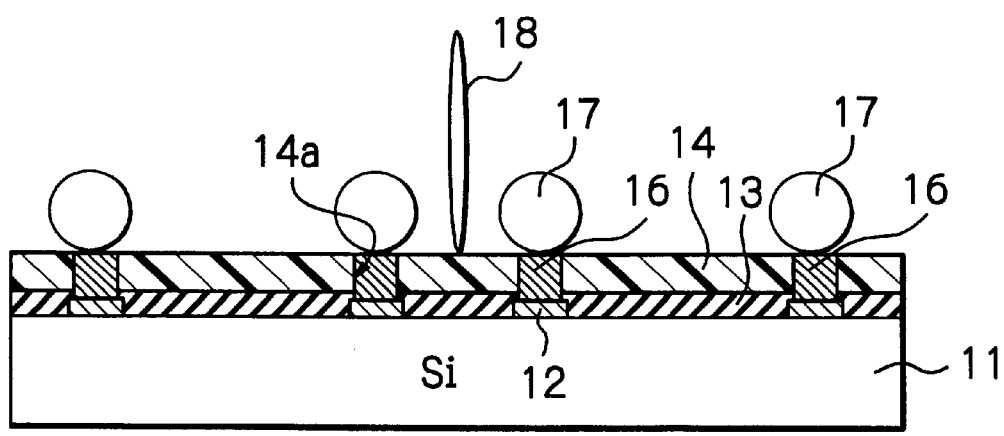
Figure 2J:
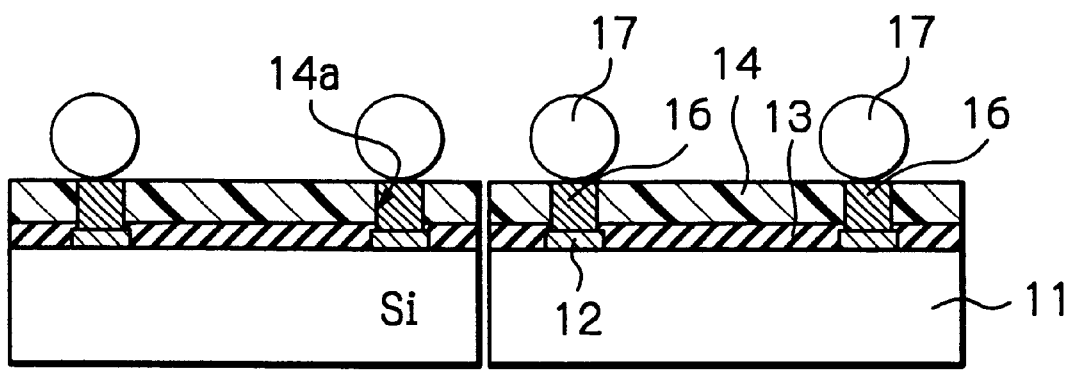

Next, referring to FIG. 2I, the device is cut by a dicing blade 18 to separate flip-chip type semiconductor chips (pellets) from each other, as illustrated in FIG. 2J.

Figure 4:
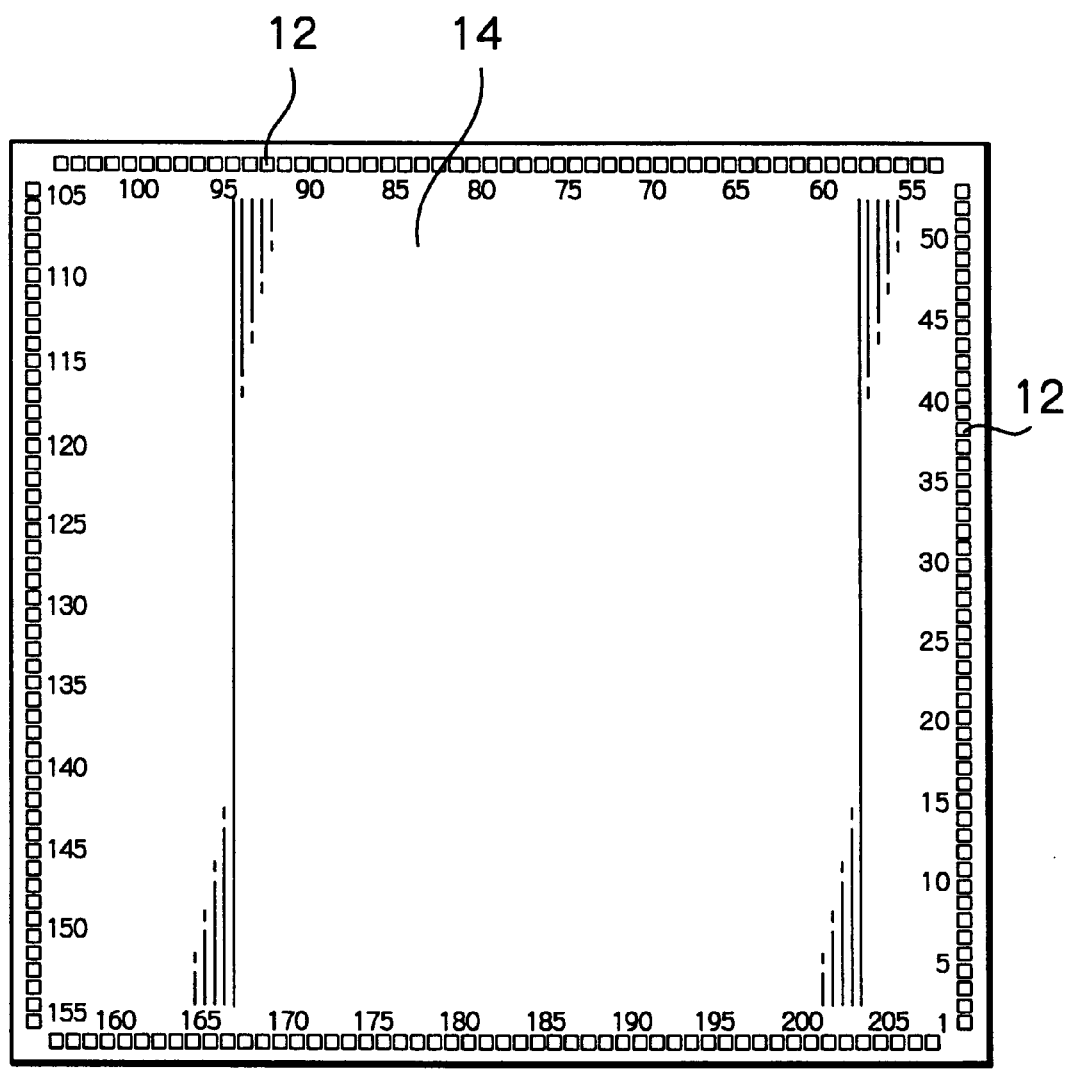
FIG. 4 is a detailed plan view of the flip-chip type semiconductor device of FIG. 3.

One of the flip-chip type semiconductor chips obtained by the manufacturing method as illustrated in FIGS. 2A through 2J is illustrated in FIG. 3. In FIG. 3, the pad electrodes 12 are arranged at the periphery of the flip-chip type semiconductor chip and are surrounded by the insulating stress-absorbing resin layer 14, and the metal bumps 17 are arranged on the pad electrodes 12. Actually, the number of the pad electrodes 12 is very large as illustrated in FIG. 4.

According to the above-described first embodiment, since the insulating stress-absorbing resin layer 14 and the flexible conductive layer 16 disperse shearing stress occurring at the metal bumps 17, the reliability of the flip-chip type semiconductor device would be improved. Additionally, since the insulating stress-absorbing resin layer 14 is made of thermosetting resin which includes little contamination, the flip-chip type semiconductor device would be further improved.

A second embodiment of the method for manufacturing a flip-chip type semiconductor device according to the present invention will be explained next with reference to FIGS. 5A through 5F.

Figure 5A:
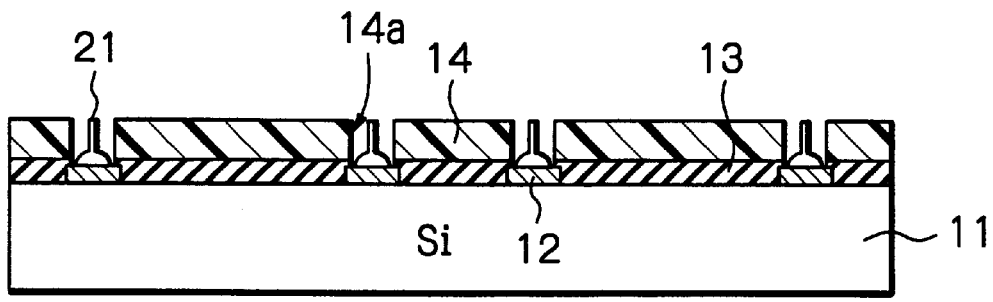
FIGS. 5A through 5F are cross-sectional views for explaining a second embodiment of the method for manufacturing a flip-chip type semiconductor device according to the present invention.

After the steps as illustrated in FIGS. 2A through 2D of the first embodiment are carried out, referring to FIG. 5A, conductive wire 21 made of Au or Cu is connected to the pad electrodes 12 via conductive adhesives (not shown) by a wire bonding process.

Figure 5B:
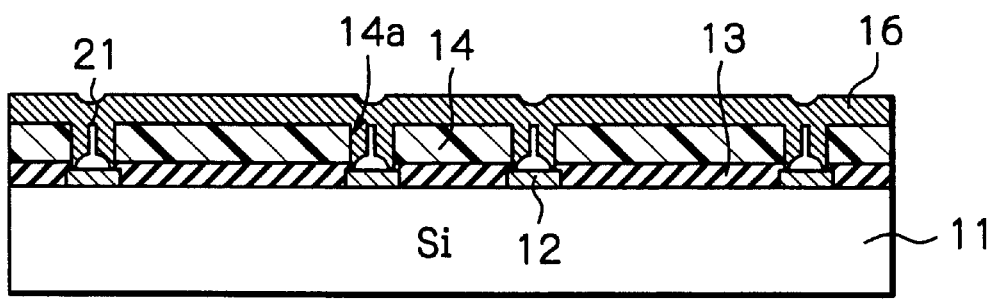

Next, referring to FIG. 5B, in a similar way to those of FIG. 2F, a flexible conductive layer 16 is coated on the insulating stress-absorbing resin layer 14 by a screen printing method or the like, so that the flexible conductive layer 16 is filled in the openings 14a, to completely cover the conductive wire 21. The flexible conductive layer 16 is made of powdered material of at least one of copper (Cu), lead (Pb), tin (Sn), nickel (Ni), palladium (Pd), silver (Ag) or gold (Au), that shows excellent solder-wettability characteristics as well as excellent flexibility characteristics.

Figure 5C:
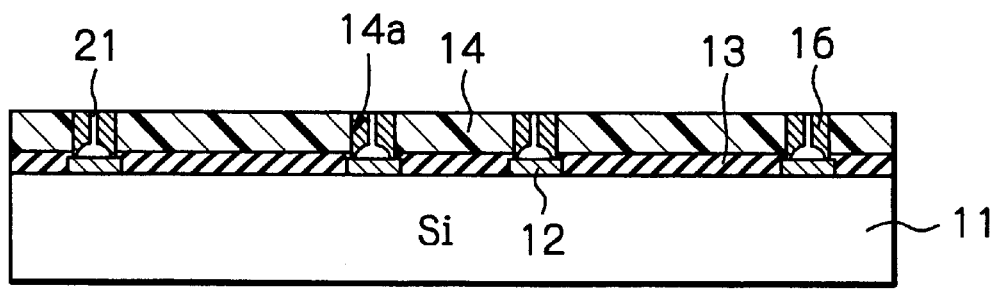

Next, referring to FIG. 5C, in the same way in FIG. 2G, the flexible conductive layer 16 is flattened by a CMP process, so that the flexible conductive layer 16 is filled only in the openings 14a. In this case, a plasma surface treatment may be carried out to remove polishing waste caused by the CMP process.

Figure 5D:
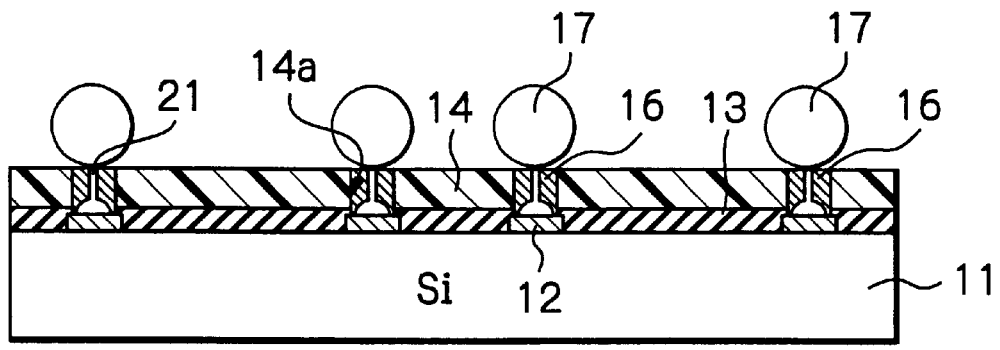

Next, referring to FIG. 5D, in the same way as in FIG. 2H, an electroless Cu plating process or an electroless Ni plating process is carried out to form land portions (not shown) on the pad electrodes 12. The land portions can be formed by carrying out an electroless Au plating process after an electrolytic Cu plating process. Then, metal bumps (solder balls) 17 made of Sn and Pb are soldered to the pad electrodes 12 via the land portions. Thus, since the land portions improves the wettability of the metal bumps 17, the metal bumps 17 can be securely adhered to the pad electrodes 12.

Even in FIG. 5D, in the same way as in FIG. 2H, flux (not shown) instead of the land portions can be coated on the pad electrodes 12, and then, metal bumps 17 are soldered to the pad electrodes 12 and a heating reflowing process is performed thereupon. Even in this case, the metal bumps 17 can be securely adhered to the pad electrodes 12.

Note that the metal bumps 17 can be made of Au or Sn—Ag alloy.

Figure 5E:
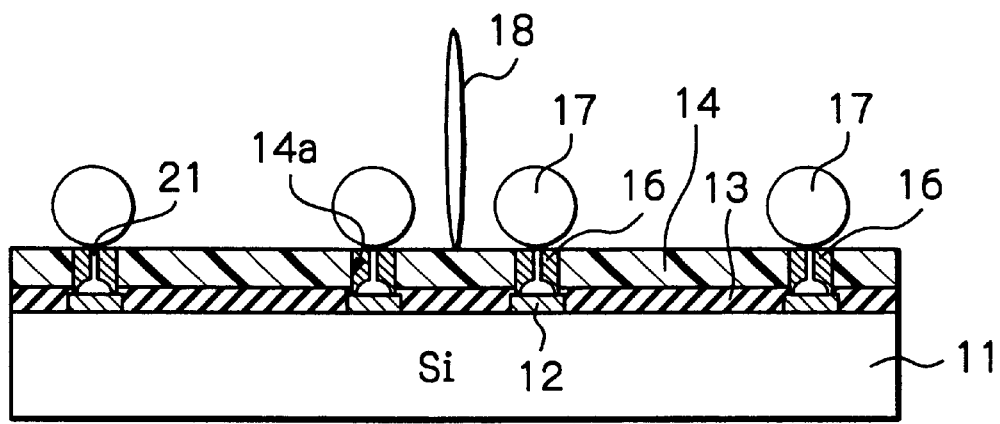
Figure 5F:
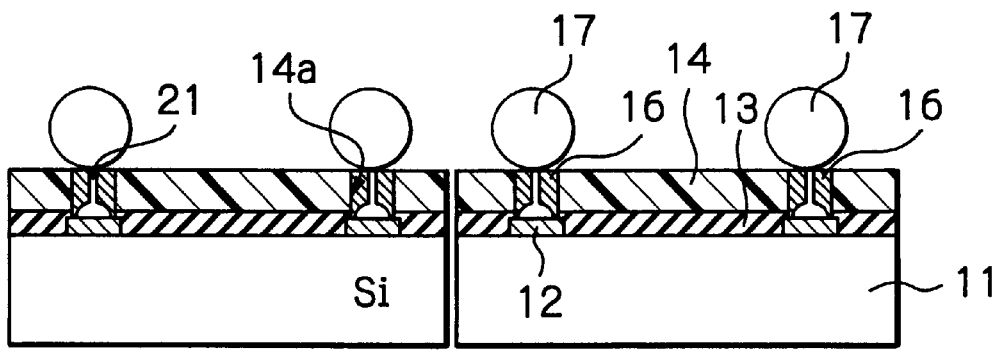

Next, referring to FIG. 5E, in the same way as in FIG. 2I, the device is cut by a dicing blade 18 to separate flip-chip type semiconductor chips (pellets) from each other, as illustrated in FIG. 5F.

Thus, in the second embodiment, the metal bumps 17 can be more surely electrically-connected to the pad electrodes 12 due to the presence of the conductive wire 21 as compared with the first embodiment.

A third embodiment of the method for manufacturing a flip-chip type semiconductor device according to the present invention will be explained next with reference to FIGS. 6A through 6N.

Figure 6A:
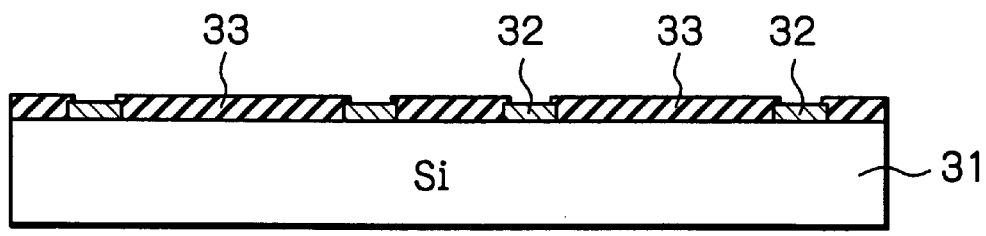
FIGS. 6A through 6N are cross-sectional views for explaining a third embodiment of the method for manufacturing a flip-chip type semiconductor device.

First, referring to FIG. 6A, in the same way as in FIG. 2A, pad electrodes 32 made of aluminum (Al) or copper (Cu) are formed on a silicon substrate 31. Then, a passivation layer 33 made of non-organic material such as silicon oxide ($SiO_2$) or organic material such as polyimide is deposited on the silicon substrate 31 to protect active areas thereof.

Figure 6B:
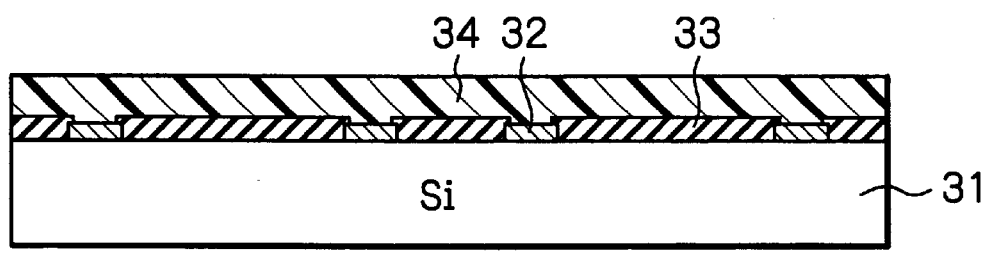

Next, referring to FIG. 6B, in the same way as in FIG. 2B, an insulating stress-absorbing resin layer 34 made of thermosetting resin such as epoxy resin, silicone resin, polyimide resin, polyolefin resin, cyanate-ester resin, phenol resin, naphthalene resin or fluorene resin is coated on the entire surface by a spin-coating process. Note that the modulus of elasticity of the insulating stress-absorbing resin layer 34 is approximately from 0.01 to 8 GPa.

Figure 6C:
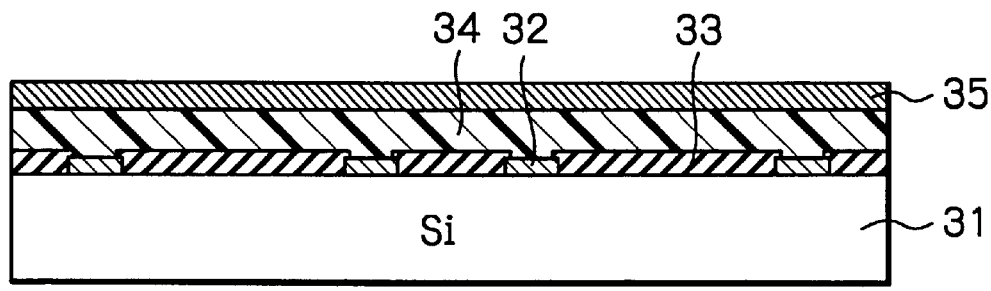

Next, referring to FIG. 6C, a Cu layer 35 is deposited on the insulating stress-absorbing resin layer 34.

Note that other metal such as nickel can be used for the layer 35.

Figure 6D:
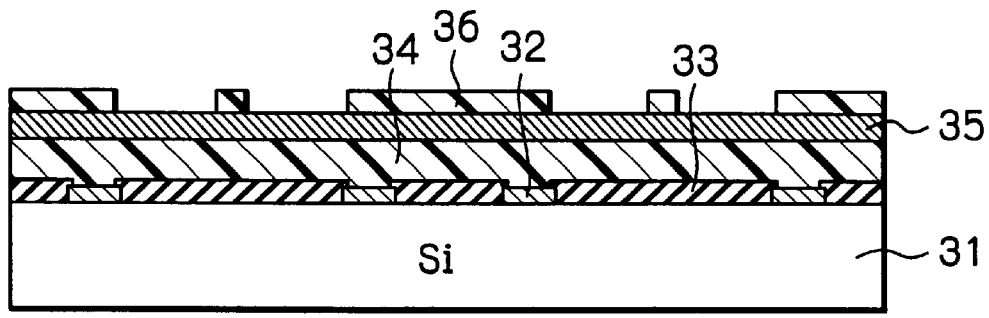

Next, referring to FIG. 6D, a photoresist layer is coated on the entire surface, and then, the photoresist layer is patterned by a photolithography process to form a photoresist pattern layer 36.

Figure 6E:
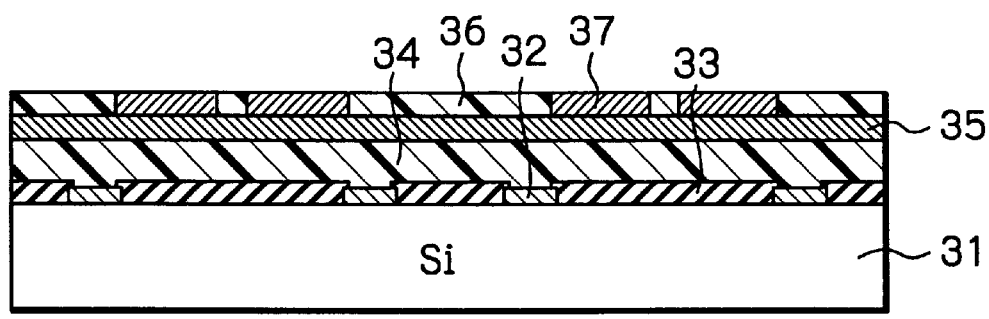

Next, referring to FIG. 6E, an Au plating layer 37 is formed on the Cu layer 35 through the photoresist pattern layer 36.

Note that other metal such as nickel can be used for the layer 35.

Figure 6F:
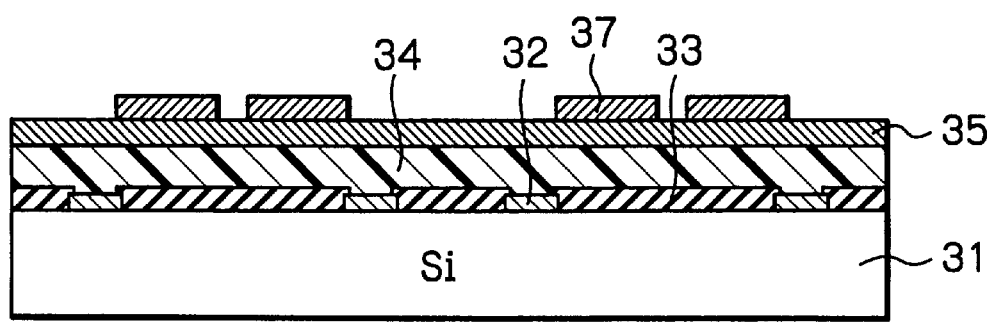

Next, referring to FIG. 6F, the photoresist pattern layer 36 is removed. The Au layer 37 serves as lands for metal bumps.

Figure 6G:
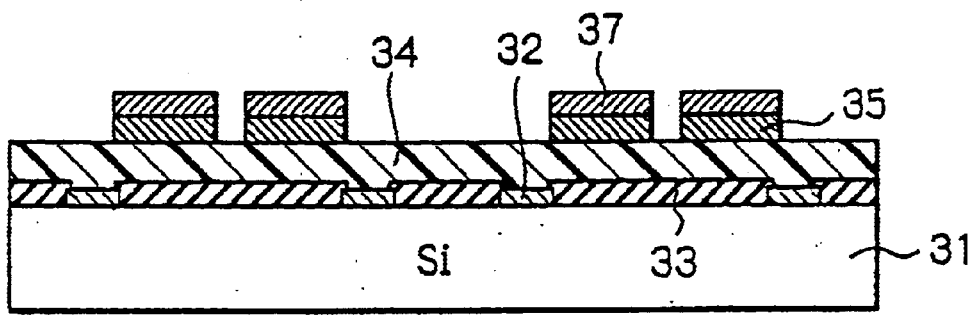

Next, referring to FIG. 6G, the Cu layer 35 is etched by a wet etching process using ferric chloride or sulfuric acid and the Au layer 37 as a mask.

Figure 6H:
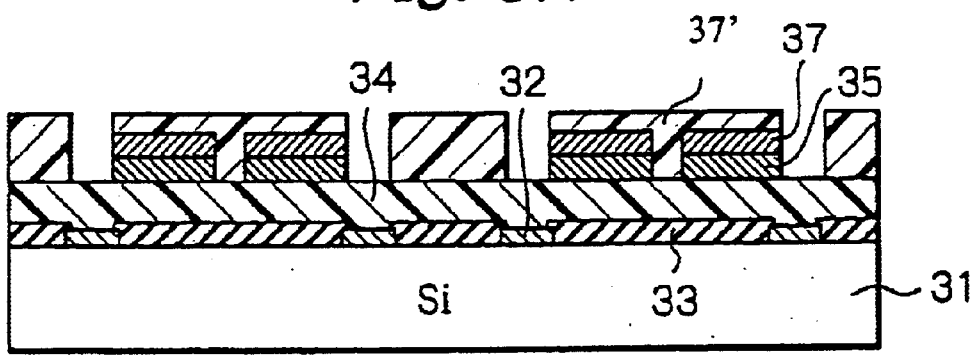

Next, referring to FIG. 6H, a photoresist pattern layer 37', which has openings corresponding to the pad electrodes 32, is formed by a photolithography process.

Figure 6I:
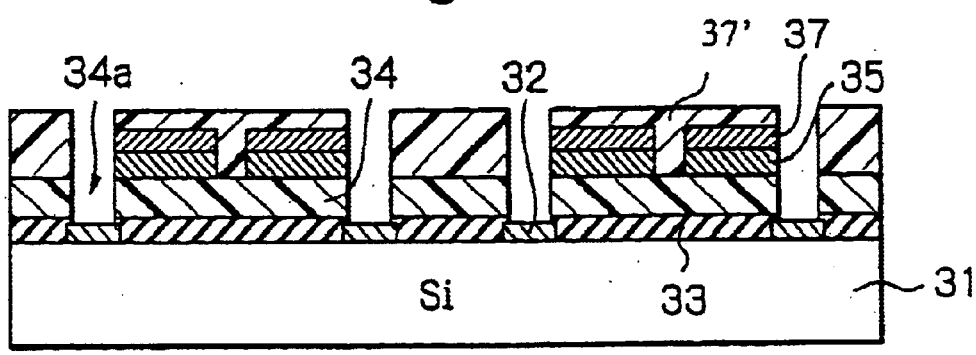

Next, referring to FIG. 6I, the insulating stress-absorbing resin layer 34 is etched by using the photoresist pattern layer 38 as a mask, to form openings 34a in the insulating stress-absorbing resin layer 34.

Figure 6J:
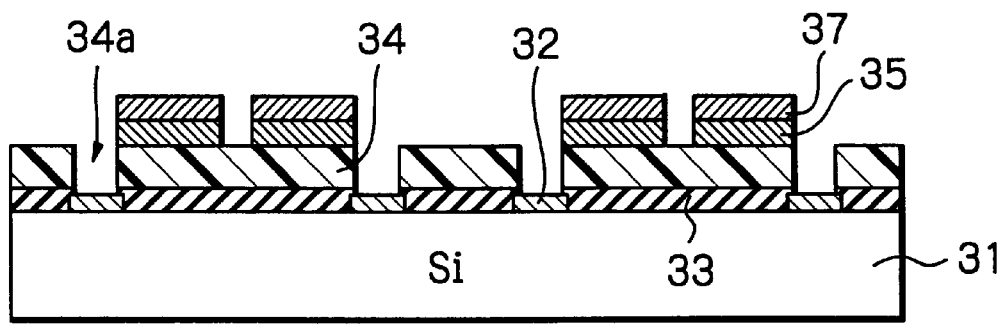

Next, referring to FIG. 6J, the photoresist pattern layer 38 is removed.

Figure 6K:
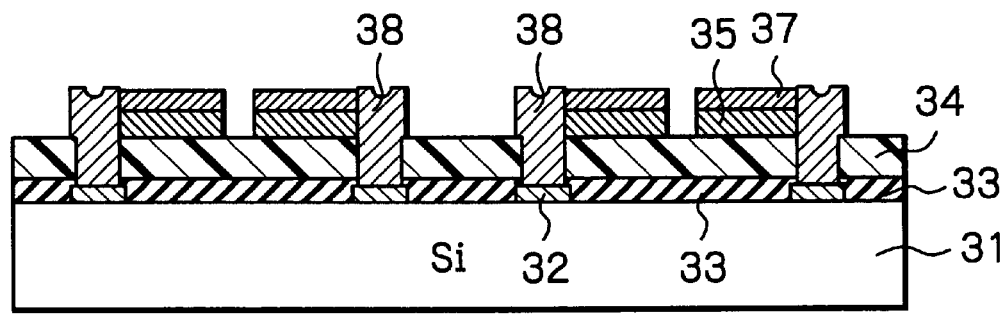

Next, referring to FIG. 6K, a flexible conductive layer 38 is coated by a screen printing method or a potting method, so that the flexible conductive layer 38 is filled only in the openings 34a, thus preventing the pad electrodes 32 from being oxidized. As a result, the Cu layer 35 and the Au layer 37 are electrically connected to the corresponding pad electrode 32 via the flexible conductive layer 38. The flexible conductive layer 38 is made of powdered material of at least one of copper (Cu), lead (Pb), tin (Sn), nickel (Ni), palladium (Pd), silver (Ag) or gold (Au), that shows excellent solder-wettability characteristics as well as excellent flexibility characteristics.

Note that a solder-resist layer or a resin layer can be coated on the portions of the Au layer 37 where metal bumps will be formed. Thus, the Au layer 37 can be protected by the solder-resist layer or the resin layer to improve the waterproof characteristics thereof.

Figure 6L:
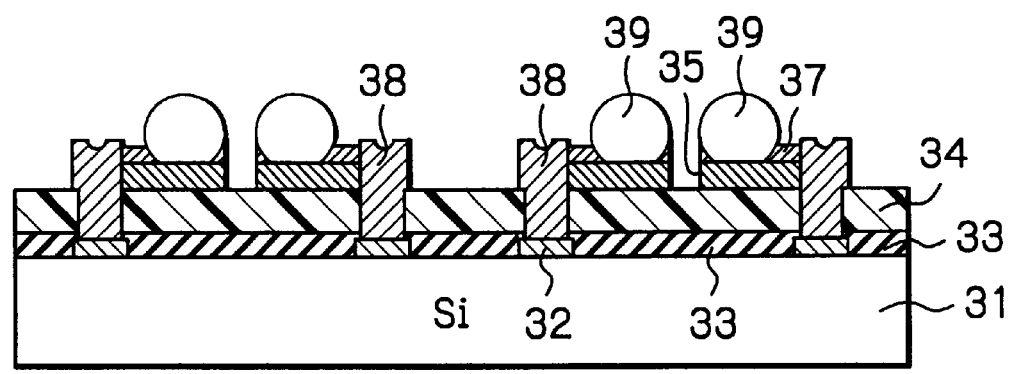

Referring to FIG. 6L, metal bumps 39 are soldered to the Au layer 37 and a heating reflowing process is performed thereupon. Even in this case, the metal bumps 39 can be securely adhered to the Au layer 37.

Note that the metal bumps 39 can be made of Au or Sn—Ag alloy.

Figure 6M:
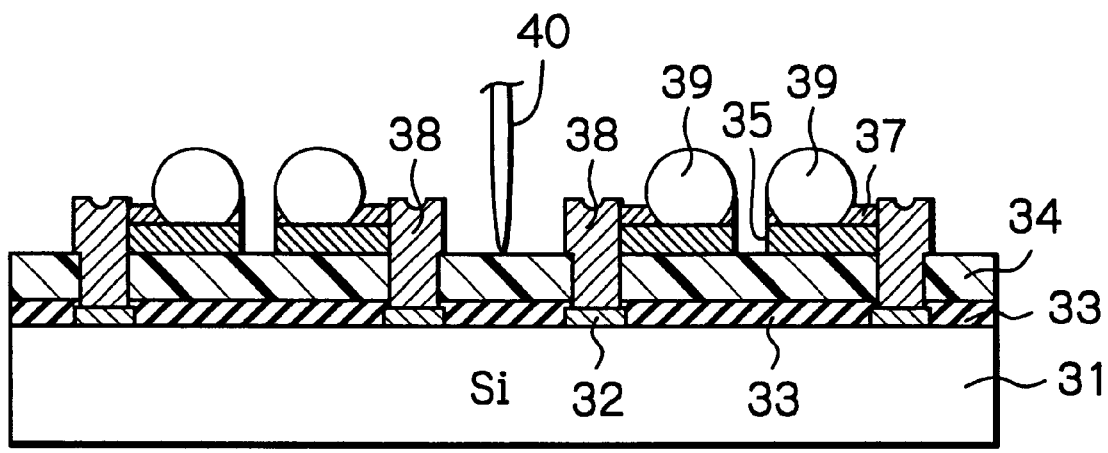
Figure 6N:
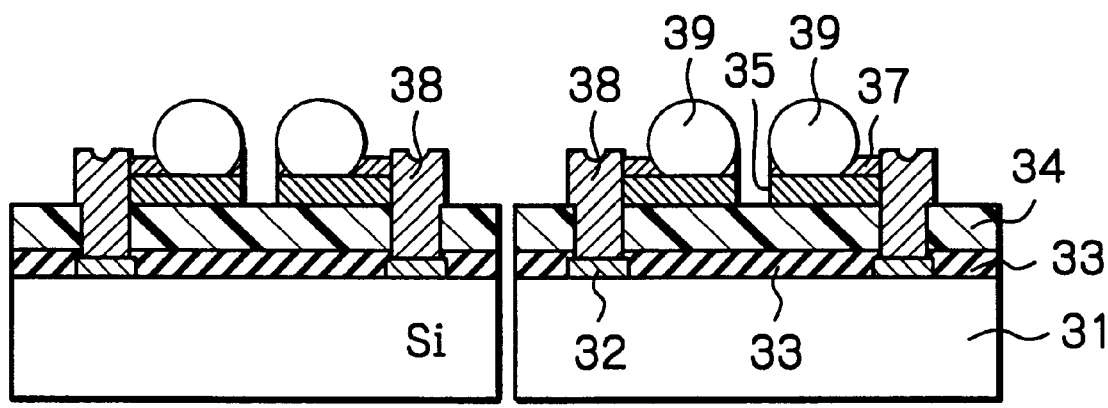

Next, referring to FIG. 6M, the device is cut by a dicing blade 40 to separate flip-chip type semiconductor chips (pellets) from each other, as illustrated in FIG. 6N.

Figure 7:
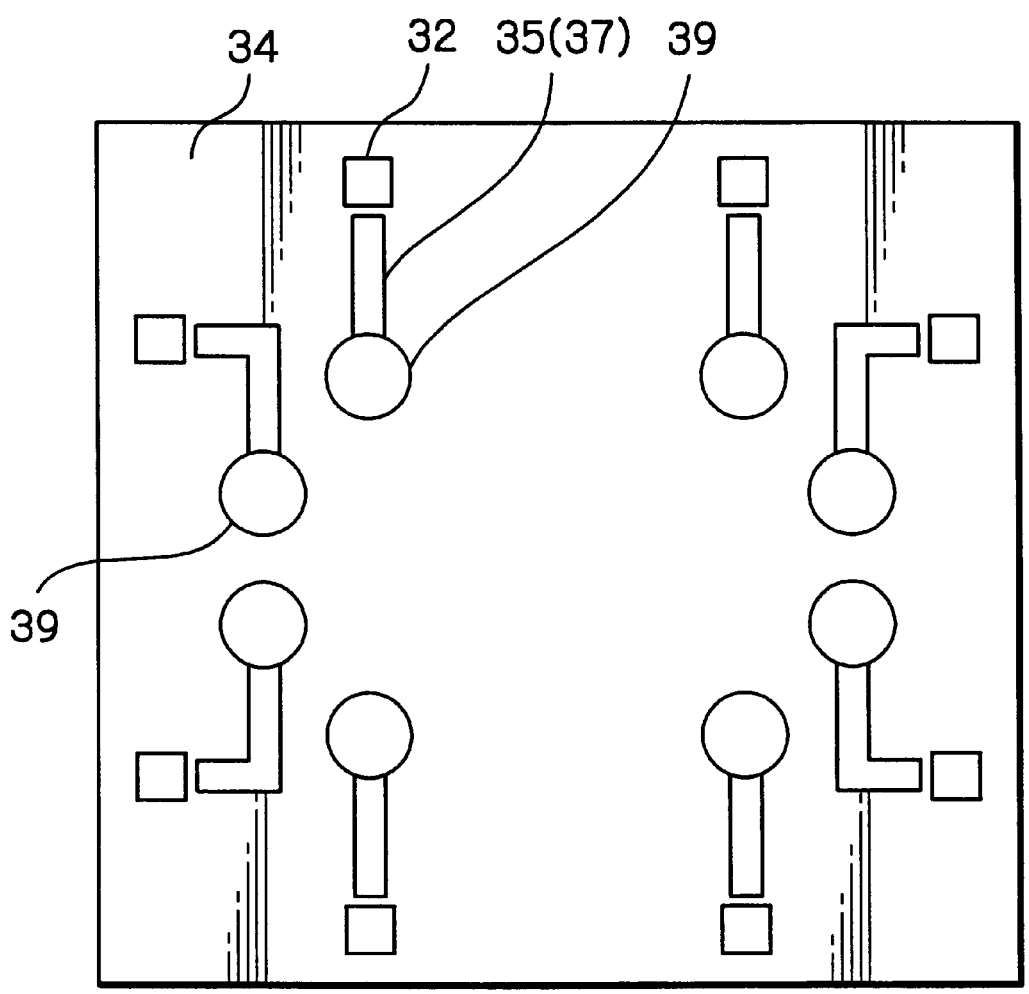
FIG. 7 is a plan view of one flip-chip type semiconductor device obtained by the method as illustrated in FIGS. 6A through 6N.

One of the flip-chip type semiconductor chips obtained by the manufacturing method as illustrated in FIGS. 6A through 6N is illustrated in FIG. 7. In FIG. 7, although the pad electrodes 32 are arranged at the periphery of the flip-chip type semiconductor chip and then surrounded by the insulating stress-absorbing resin layer 34 in the same way as in the first embodiment, the metal bumps 39 are arranged in an inner area of the flip-chip type semiconductor chip as compared with the metal bumps 25 of FIG. 3, which would prevent the metal bumps 39 from being short-circuited.

A fourth embodiment of the method for manufacturing a flip-chip type semiconductor device according to the present invention will be explained next with reference to FIGS. 8A through 8N.

Figure 8A:
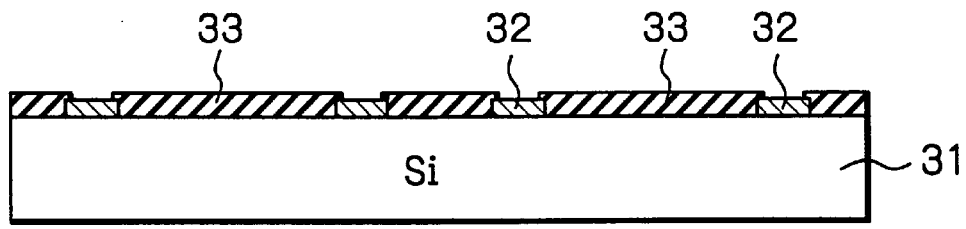
FIGS. 8A through 8N are cross-sectional views for explaining a fourth embodiment of the method for manufacturing a flip-chip type semiconductor device according to the present invention.

First, referring to FIG. 8A, in the same way as in FIG. 6A, pad electrodes 32 made of aluminum (Al) or copper (Cu) are formed on a silicon substrate 31. Then, a passivation layer 32 made of non-organic material such as silicon oxide (SiO$_2$) or organic material such as polyimide is deposited on the silicon substrate 31 to protect active areas thereof.

Figure 8B:
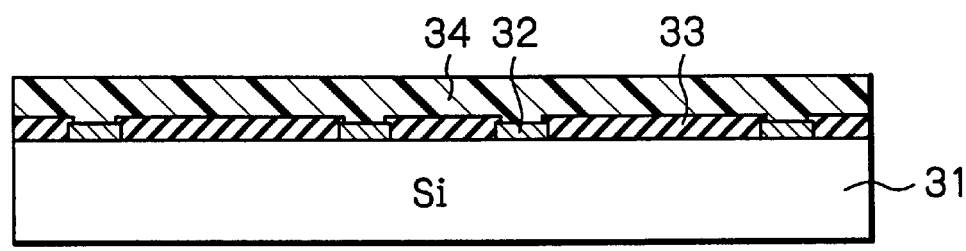

Next, referring to FIG. 8B, in the same way as in FIG. 6B, an insulating stress-absorbing resin layer 34 made of thermosetting resin such as epoxy resin, silicone resin, polyimide resin, polyolefin resin, cyanate-ester resin, phenol resin, naphthalene resin or fluorene resin is coated on the entire surface by a spin-coating process. Note that the modulus of elasticity of the insulating stress-absorbing resin layer 34 is approximately from 0.01 to 8 GPa.

Figure 8C:
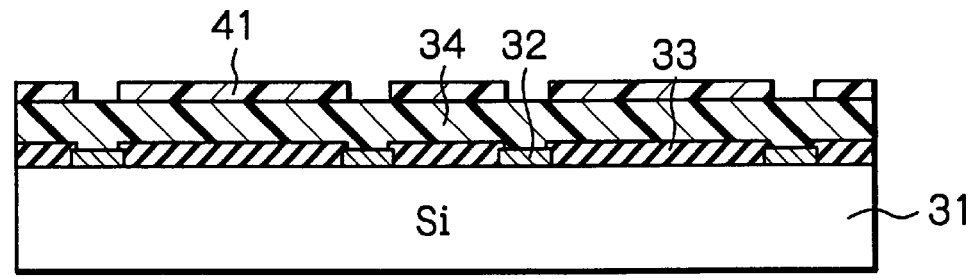

Next, referring to FIG. 8C, a photoresist pattern layer 41, which has openings corresponding to the pad electrodes 32, is formed by a photolithography process.

Figure 8D:
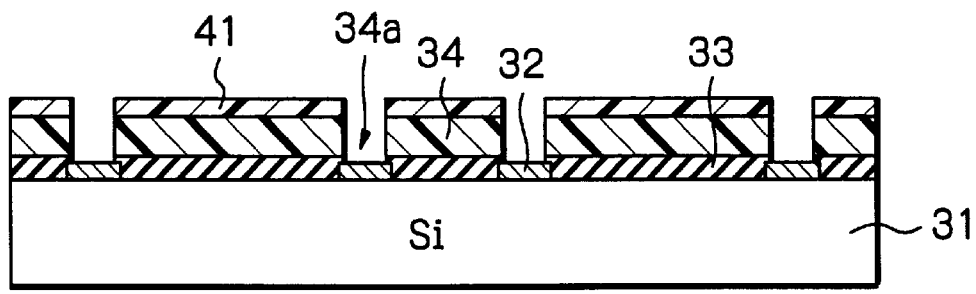

Next, referring to FIG. 8D, the insulating stress-absorbing resin layer 34 is etched by using the photoresist pattern layer 41 as a mask. As a result, openings 34a corresponding to the pad electrodes 32 are perforated in the insulating stress-absorbing resin layer 34.

Figure 8E:
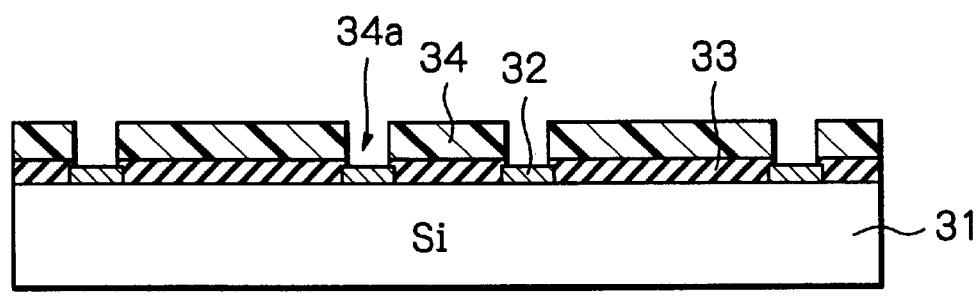

Next, referring to FIG. 8E, the photoresist pattern layer 41 is removed.

Figure 8F:
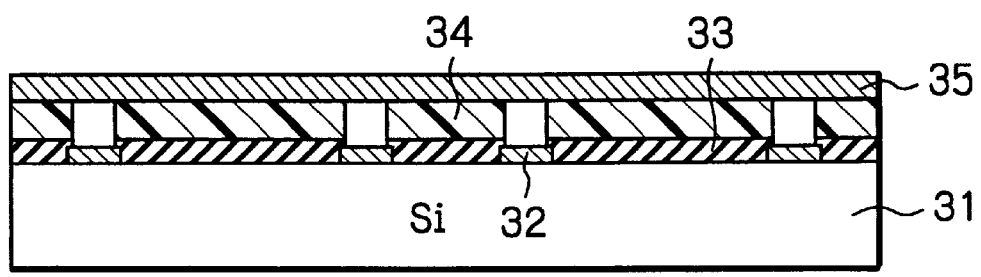

Next, referring to FIG. 8F, in a similar way to that of FIG. 6C, a Cu layer 35 is formed on the insulating stress-absorbing resin layer 34 by using a film laminating method or a pressing method.

Note that other metal such as nickel can be used for the layer 35.

Figure 8G:
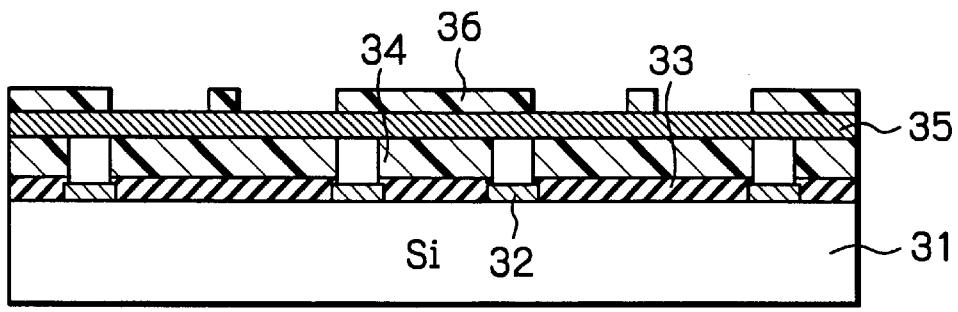

Next, referring to FIG. 8G, in the same way as in FIG. 6D, a photoresist layer is coated on the entire surface, and then, the photoresist layer is patterned by a photolithography process to form a photoresist pattern layer 36.

Figure 8H:
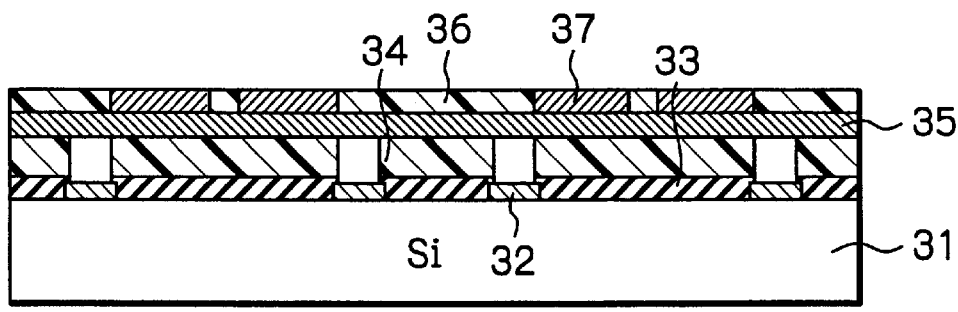

Next, referring to FIG. 8H, in the same way as in FIG. 6E, an Au plating layer 37 is formed on the Cu layer 35 through the photoresist pattern layer 36.

Note that other metal such as nickel can be used for the layer 35.

Figure 8I:
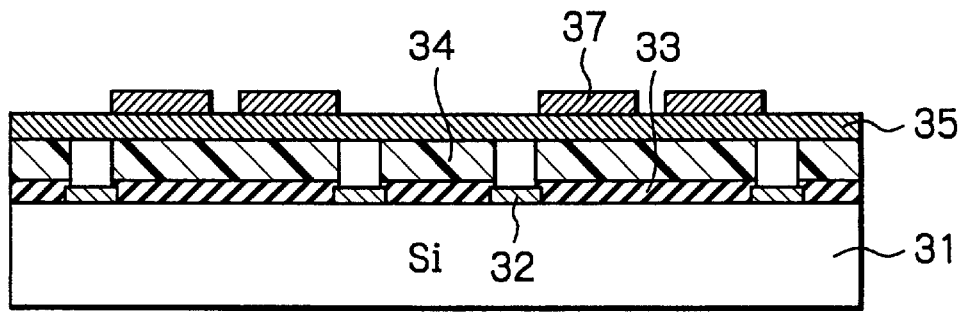

Next, referring to FIG. 8I, in the same way as in FIG. 6F, the photoresist pattern layer 36 is removed. The Au layer 37 serves as lands for metal bumps.

Figure 8J:
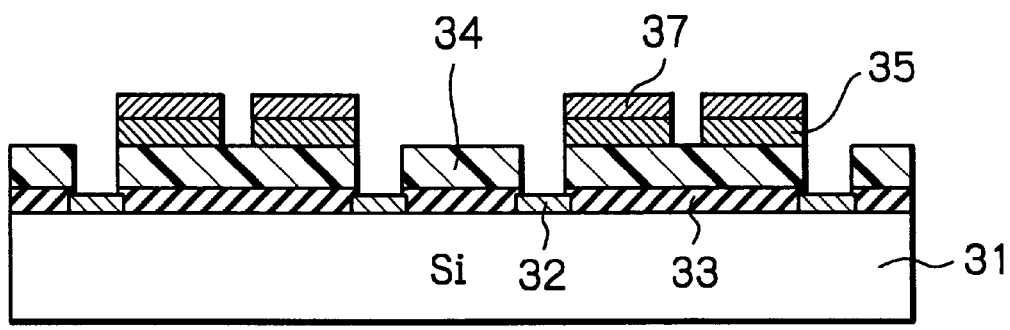

Next, referring to FIG. 8J, in the same way as in FIG. 6G, the Cu layer 35 is etched by a wet etching process using ferric chloride or sulfuric acid and the Au layer 37 as a mask.

Figure 8K:
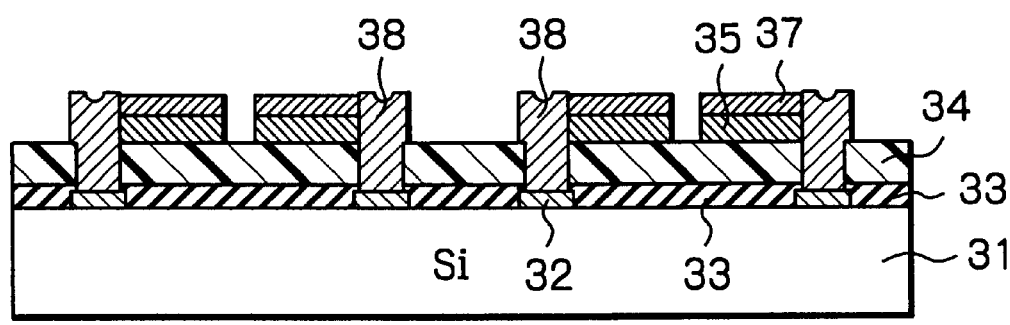

Next, referring to FIG. 8K, in the same way as in FIG. 6K, a flexible conductive layer 38 is coated on the insulating stress-absorbing resin layer 34 by a screen printing method or a potting method, so that the flexible conductive layer 38 is filled only in the openings 34a, thus preventing the pad electrodes 32 from being oxidized. As a result, the Cu layer 35 and the Au layer 37 are electrically connected to the corresponding pad electrode 32 via the flexible conductive layer 38. The flexible conductive layer 16 is made of powdered material of at least one of copper (Cu), lead (Pb), tin (Sn), nickel (Ni), palladium (Pd), silver (Ag) or gold (Au), that shows excellent solder-wettability characteristics as well as excellent flexibility characteristics.

Note that a solder-resist layer or a resin layer can be coated on the portions of the Au layer 37 where metal bumps will be formed. Thus, the Au layer 37 can be protected by the solder-resist layer or the resin layer to improve the waterproof characteristics.

Figure 8L:
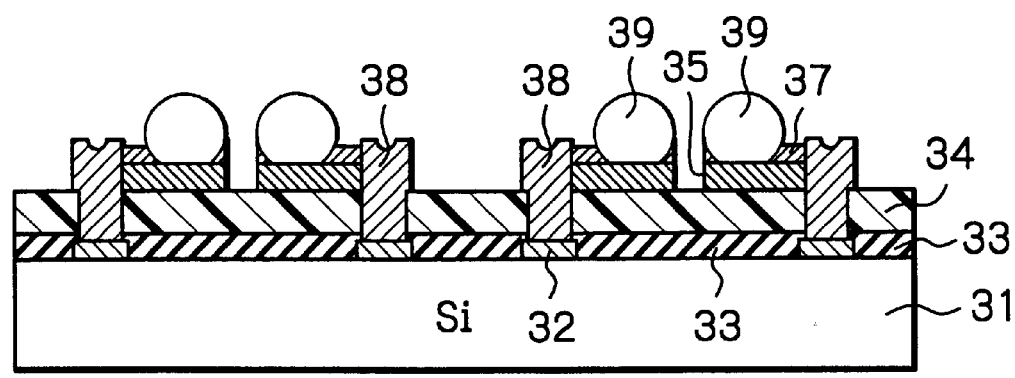

Referring to FIG. 8L, in the same way as in FIG. 6L, metal bumps 39 are soldered to the pad electrodes 32 and a heating reflowing process is performed thereupon. Even in this case, the metal bumps 39 can be securely adhered to the pad electrodes 32.

Note that the metal bumps 39 can be made of Au or Sn—Ag alloy.

Figure 8M:
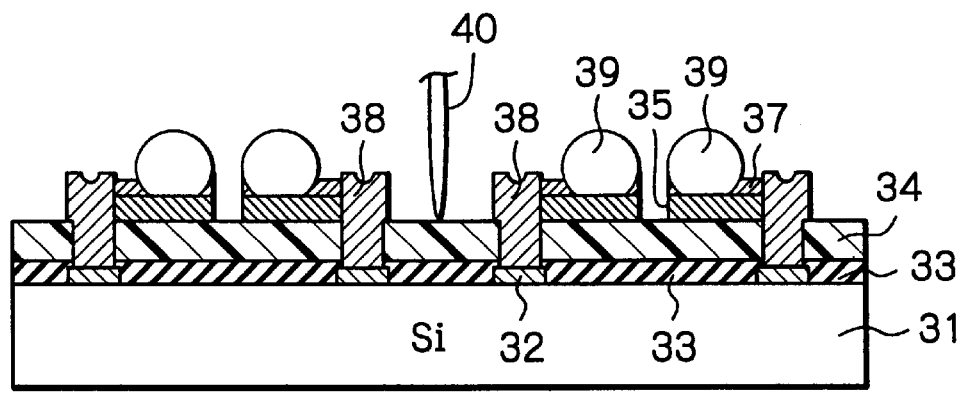
Figure 8N:
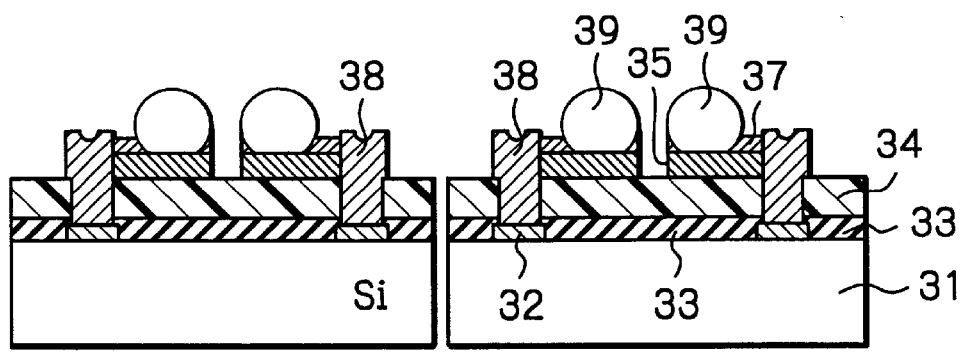

Next, referring to FIG. 8M, in the same way as in FIG. 6M, the device is cut by a dicing blade 40 to separate flip-chip type semiconductor chips (pellets) from each other, as illustrated in FIG. 8N.

In the fourth embodiment, although the steps as illustrated in FIGS. 8C and 8D are added to the third embodiment, the steps as illustrated in FIGS. 6H, 6I and 6J of the third embodiment are omitted, which would decrease the manufacturing cost.

A modification of the third embodiment of the present invention will be explained next with reference to FIGS. 9A through 9C.

Figure 9A:
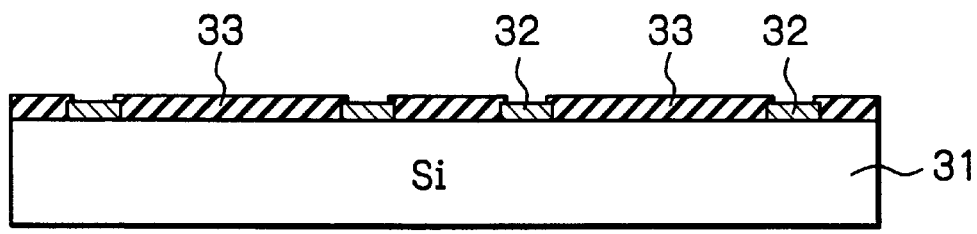
FIGS. 9A, 9B and 9C are cross-sectional views illustrating a modification of the third embodiment as illustrated in FIGS. 6A through 6N.

First, referring to FIG. 9A, in the same way as in FIG. 6A, pad electrodes 32 made of aluminum (Al) or copper (Cu) are formed on a silicon substrate 31. Then, a passivation layer 32 made of non-organic material such as silicon oxide (SiO$_2$) or organic material such as polyimide is deposited on the silicon substrate 31 to protect active areas thereof.

Figure 9B:
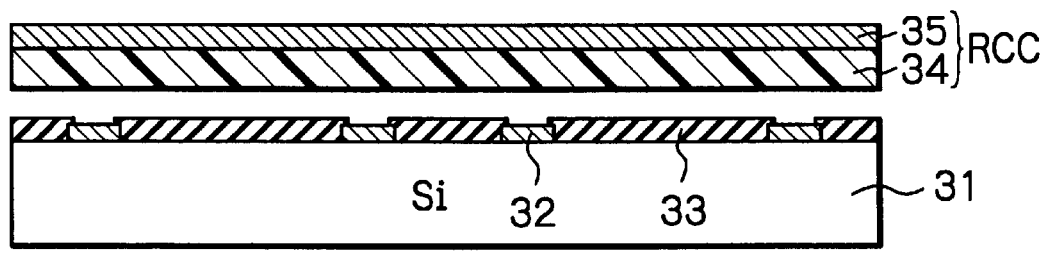

Next, referring to FIG. 9B, a resin coated copper (RCC) layer consisting of an insulating stress-absorbing resin layer 34 laminated by a Cu layer 35 is prepared.

Figure 9C:
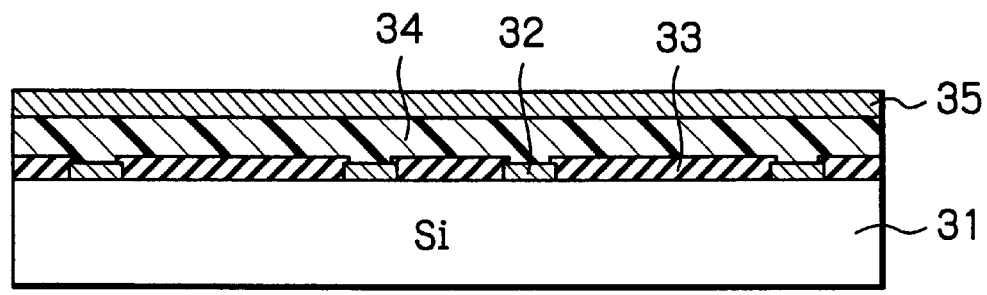

Next, referring to FIG. 9C, the RCC layer (34, 35) is adhered to the pad electrodes 32 and the passivation layer 33 by a film laminating method or a pressing method. In this case, since the RCC layer (34, 35) has good adhesive characteristics, the RCC layer (34, 35) per se can be easily adhered to the pad electrodes 32 and the passivation layer 33.

After that, the steps as illustrated in FIGS. 6D through 6N are carried out to complete a flip-chip type semiconductor chip.

A modification of the fourth embodiment of the present invention will be explained next with reference to FIGS. 9A through 9C.

Figure 10A:
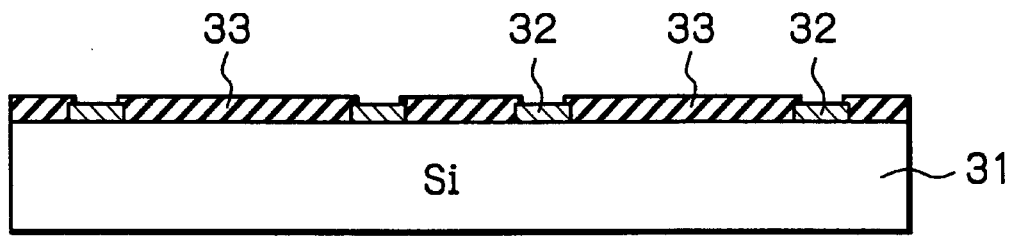
FIGS. 10A, 10B and 10C are cross-sectional views illustrating a modification of the fourth embodiment as illustrated in FIGS. 8A through 8N.

First, referring to FIG. 10A, in the same way as in FIG. 8A, pad electrodes 32 made of aluminum (Al) or copper (Cu) are formed on a silicon substrate 31. Then, a passivation layer 32 made of non-organic material such as silicon oxide (SiO$_2$) or organic material such as polyimide is deposited on the silicon substrate 31 to protect active areas thereof.

Figure 10B:
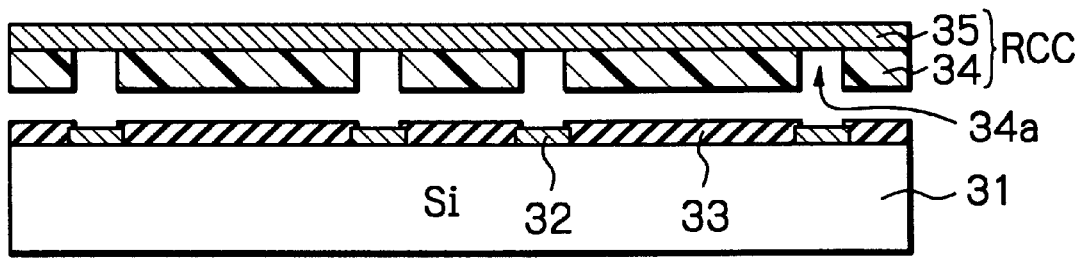

Next, referring to FIG. 10B, an RCC layer consisting of an insulating stress-absorbing resin layer 34 laminated by a Cu layer 35 is prepared. In this case, openings 34a are perforated in the insulating stress-absorbing resin layer 34 in advance by an etching process or the like.

Figure 10C:
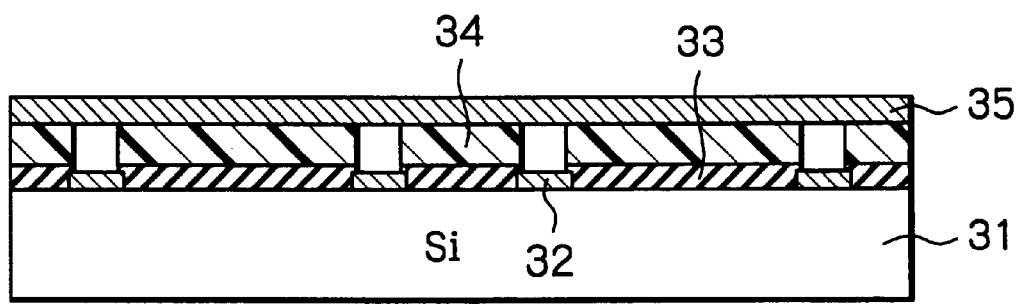

Next, referring to FIG. 10C, the RCC layer (34, 35) is adhered to the pad electrodes 32 and the passivation layer 33 by a film laminating method or a pressing method. In this case, since the RCC layer (34, 35) has good adhesive characteristics, the RCC layer (34, 35) per se can be easily adhered to the pad electrodes 32 and the passivation layer 33.

After that, the steps as illustrated in FIGS. 8G through 8N are carried out to complete a flip-chip type semiconductor chip.

Another modification of the third and fourth embodiments of the present invention will be explained next with reference to FIGS. 11A through 11E. After the steps of FIGS. 6A through 6J or the steps of FIGS. 8A through 8J are carried out, the steps of FIGS. 11A through 11E are carried out.

Figure 11A:
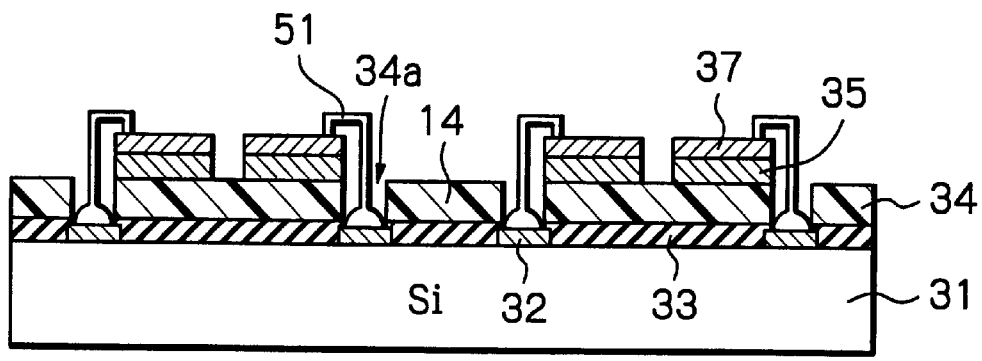
FIGS. 11A through 11E are cross-sectional views illustrating another modification of the third and fourth embodiments as illustrated in FIGS. 6A through 6N and FIGS. 8A through 8N.

First, referring to FIG. 11A, conductive wiring 51 made of Au or Cu is formed by using a wire bonding process, to electrically connect the pad electrodes 32 to the Cu layer 35 and the Au layer 37. Note that, the pad electrodes 32 are subjected to a plasma surface treatment before the wire bonding process, to remove etching remainder of the insulating stress-absorbing resin layer 34 on the pad electrodes 32 and oxide thereon, which would improve the wire bonding characteristics.

Figure 11B:
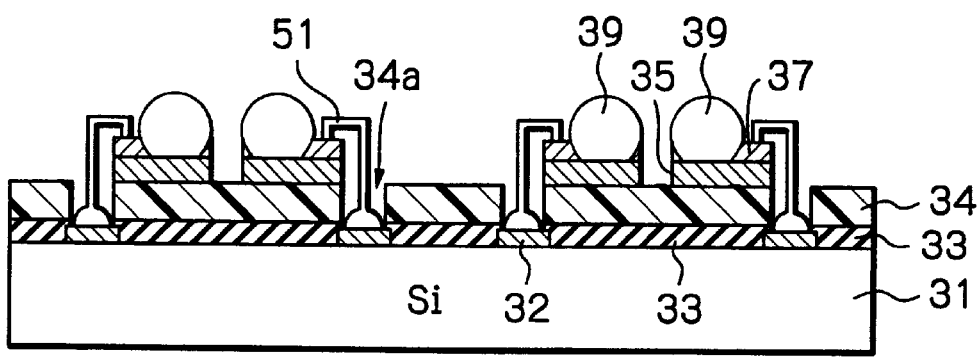

Next, referring to FIG. 11B, metal bumps 39 are soldered to the pad electrodes 32 and a heating reflowing process is performed thereupon. Even in this case, the metal bumps 39 can be securely adhered to the pad electrodes 32.

Figure 11C:
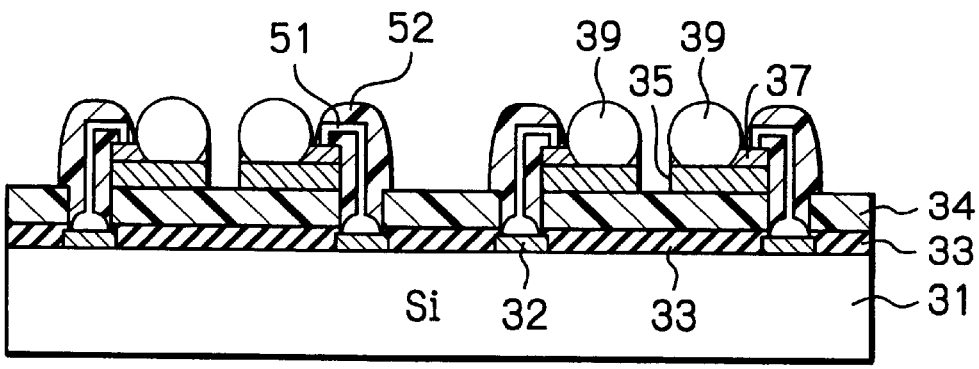

Next, referring to FIG. 11C, an insulating resin layer 52 is filled in the openings 34a, to mechanically and chemically protect the conductive wiring 51 as well as to enhance the water-vapor proof characteristics.

The insulating resin layer 52 can be made of the same or similar material as that of the insulating stress-absorbing resin layer 34. If the insulating resin layer 52 is liquid, a partial coating process is performed upon the conductive wiring 51 by a potting method. On the other hand, if the insulating resin layer 52 is solid, the conductive wiring 51 can be partially sealed by a transfer sealing method using metal molds.

Note that the metal bumps 39 can be made of Au or Sn—Ag alloy.

Figure 11D:
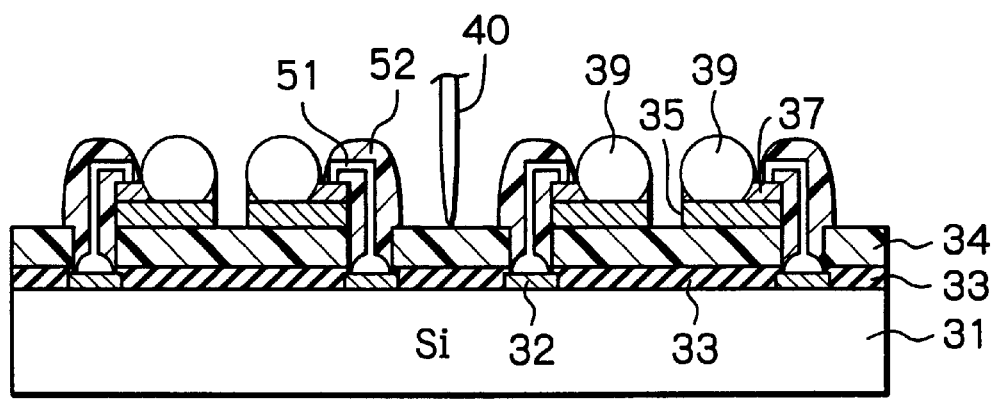
Figure 11E:
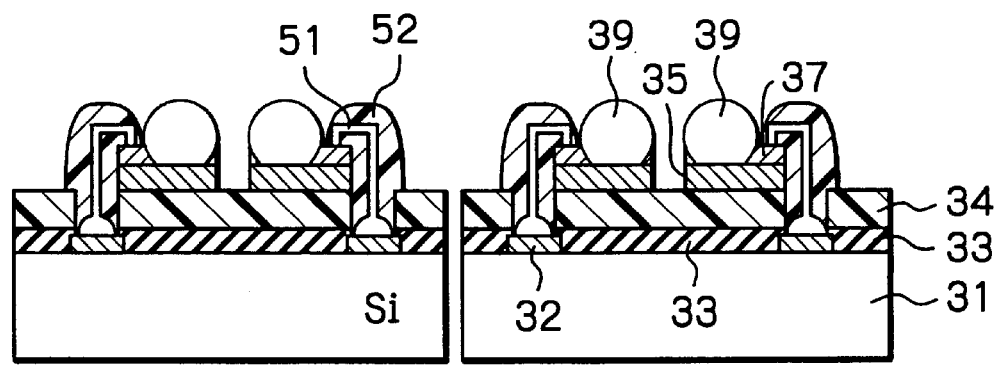

Next, referring to FIG. 11D, the device is cut by a dicing blade 40 to separate flip-chip type semiconductor chips (pellets) from each other, as illustrated in FIG. 11E.

A further modification of the third and fourth embodiments of the present invention will be explained next with reference to FIGS. 12A through 12E. After the steps of FIGS. 6A through 6J or the steps of FIGS. 8A through 8J are carried out, the steps of FIGS. 12A through 12E are carried out.

Figure 12A:
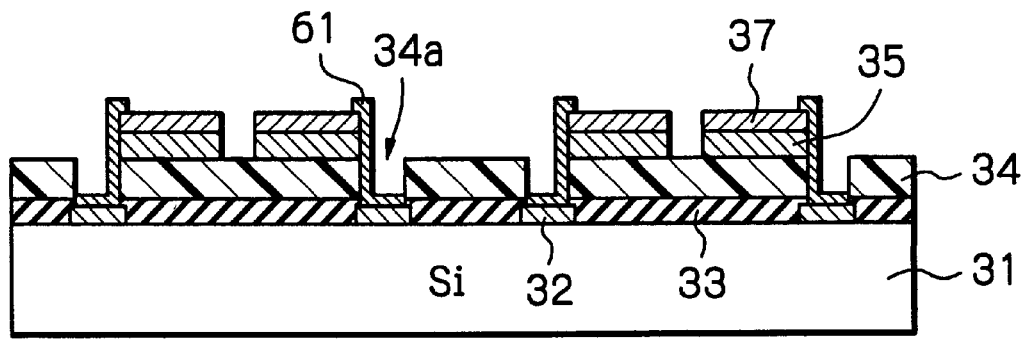
FIGS. 12A through 12E are cross-sectional views illustrating another modification of the third and fourth embodiments as illustrated in FIGS. 6A through 6N and FIGS. 8A through 8N.

First, referring to FIG. 12A, a conductive layer 61 made of Zn or NiSn is formed by using an electroless plating and etching process, to electrically connect the pad electrodes 32 to the Cu layer 35 and the Au layer 37. Note that the conductive layer 61 can be formed by adhering L-shaped conductive members made of Cu, Ni or their alloy by conductive adhesives.

Figure 12B:
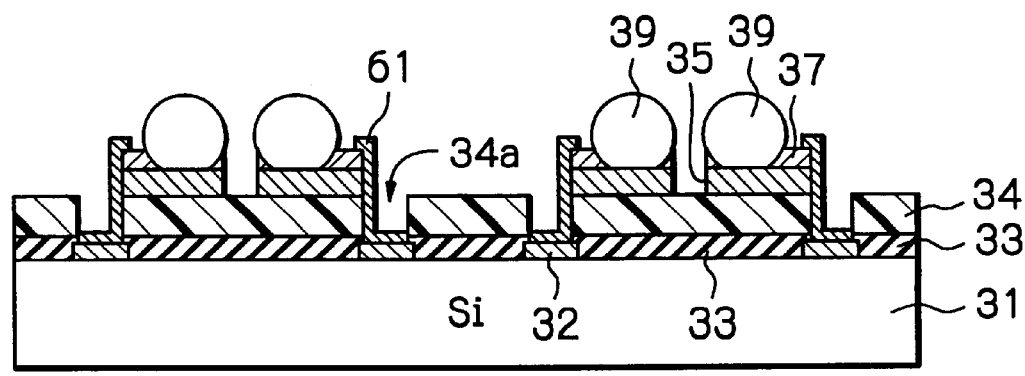

Next, referring to FIG. 12B, in the same way as in FIG. 11B metal bumps 39 are soldered to the pad electrodes 32 and a heating reflowing process is performed thereupon. Even in this case, the metal bumps 39 can be securely adhered to the pad electrodes 32.

Figure 12C:
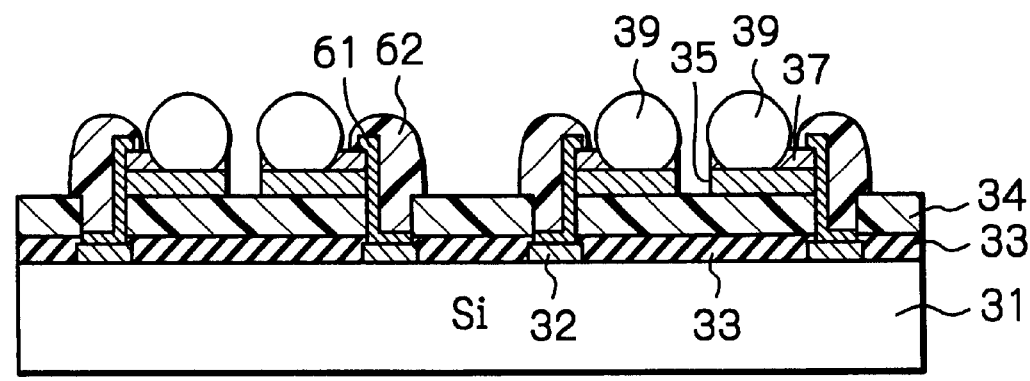

Next, referring to FIG. 12C, in the same way as in FIG. 11C, an insulating resin layer 52 is filled in the openings 34a, to mechanically and chemically protect the conductive wiring 51 as well as to enhance the water-vapor proof characteristics.

The insulating resin layer 52 can be made of the same or similar material as that of the insulating stress-absorbing resin layer 34. If the insulating resin layer 52 is liquid, a partial coating process is performed upon the conductive wiring 51 by a potting method. On the other hand, if the insulating resin layer 52 is solid, the conductive wiring 51 can be partially sealed by a transfer sealing method using metal molds.

Note that the metal bumps 39 can be made of Au or Sn—Ag alloy.

Figure 12D:
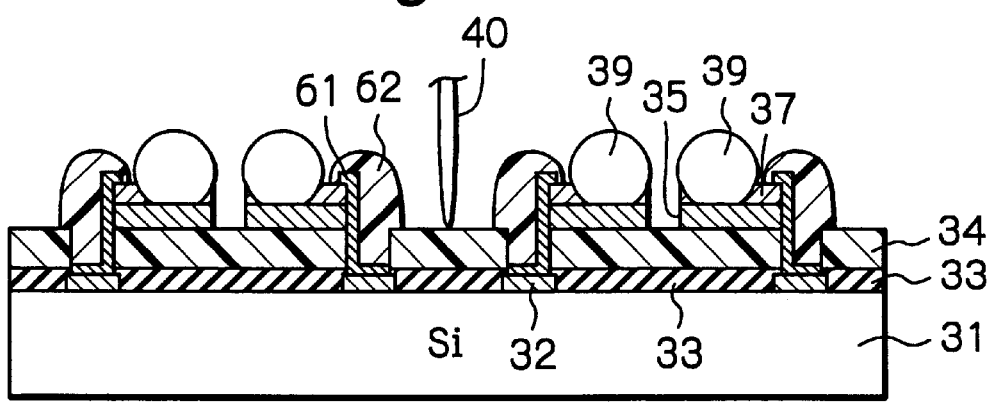
Figure 12E:
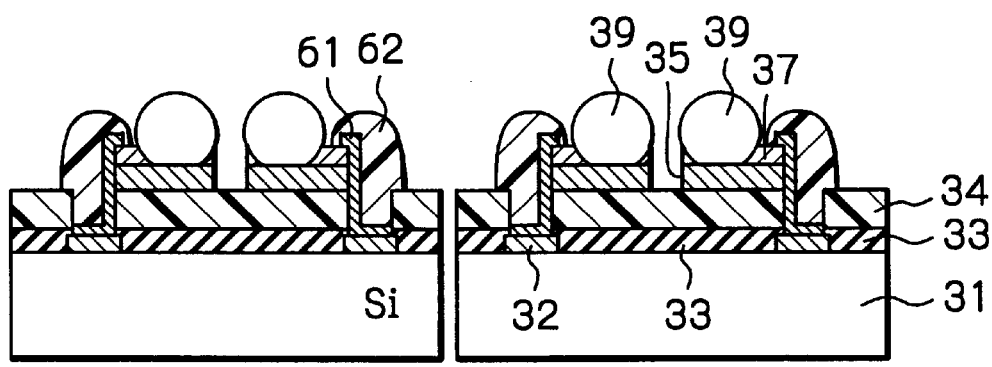

Next, referring to FIG. 12D, in the same way as in FIG. 11D, the device is cut by a dicing blade 40 to separate flip-chip type semiconductor chips (pellets) from each other, as illustrated in FIG. 12E.

A fifth embodiment of the method for manufacturing a flip-chip type semiconductor device according to the present invention will be explained next with reference to FIGS. 13A through 13N.

Figure 13A:
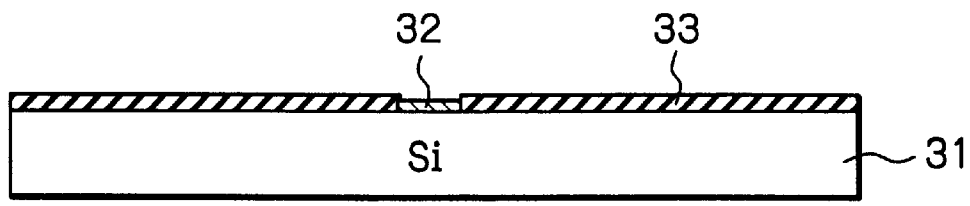
FIGS. 13A through 13M are cross-sectional views for explaining a fifth embodiment of the method for manufacturing a flip-chip type semiconductor device according to the present invention.

First, referring to FIG. 13A, in the same way as in FIG. 9A, pad electrodes 32 made of aluminum (Al) or copper (Cu) are formed on a silicon substrate 31. Then, a passivation layer 33 made of non-organic material such as silicon oxide (SiO2) or organic material such as polyimide is deposited on the silicon substrate 31 to protect active areas thereof.

Figure 13B:
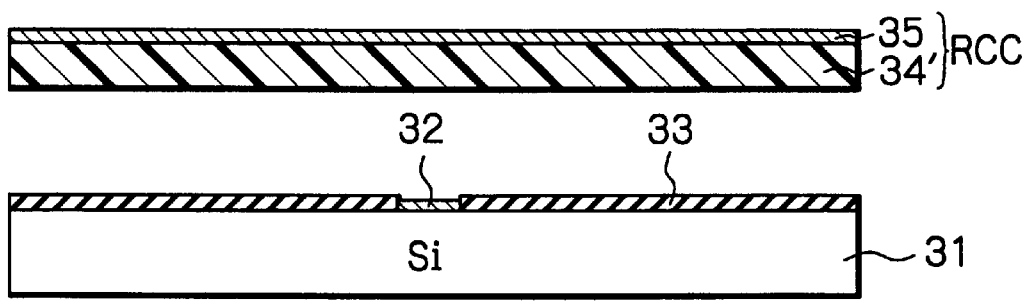

Next, referring to FIG. 13B, an RCC layer consisting of a photosensitive insulating stress-absorbing resin layer 34' laminated by a Cu layer 35 is prepared. The photosensitive insulating stress-absorbing layer 34' is made of the above-mentioned thermosetting resin combined with a photosensitive material such as bis(azide) compound or thiodiazonaphthoquinone compound.

Figure 13C:
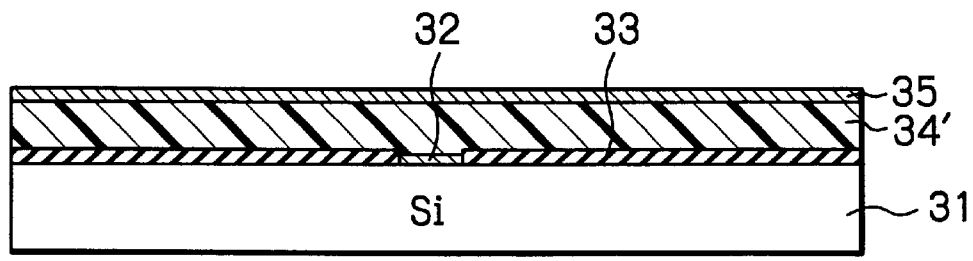

Next, referring to FIG. 13C, in the same way as in FIG. 9C, the RCC layer (34', 35) is adhered to the pad electrodes 32 and the passivation layer 33 by a film laminating method or a pressing method. In this case, since the RCC layer (34', 35) has good adhesive characteristics the RCC layer (34', 35) per se can be easily adhered to the pad electrodes 32 and the passivation layer 33.

Figure 13D:
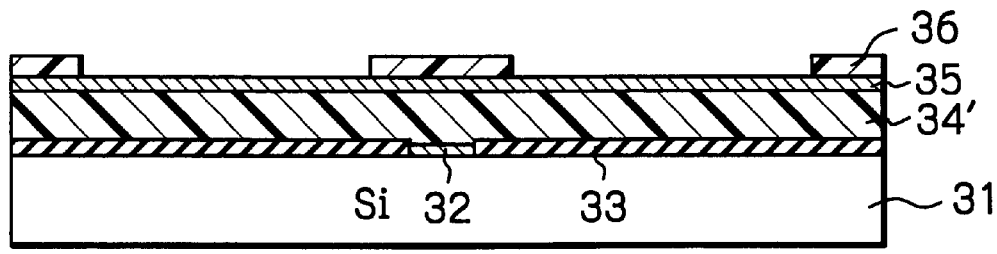

Next, referring to FIG. 13D, in the same way as in FIG. 6D, a photoresist layer is coated on the entire surface, and then, the photoresist layer is patterned by a photolithography process to form a photoresist pattern layer 36.

Figure 13E:
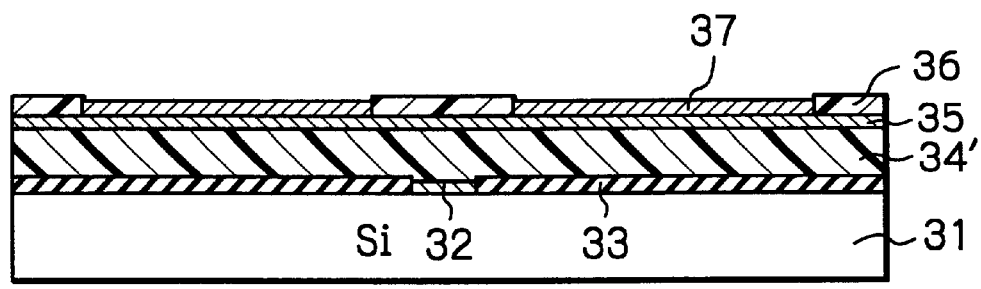

Next, referring to FIG. 13E, in the same way as in FIG. 6E, an Au plating layer 37 is formed on the Cu layer 35 through the photoresist pattern layer 36.

Note that other metal such as nickel can be used for the layer 37.

Figure 13F:
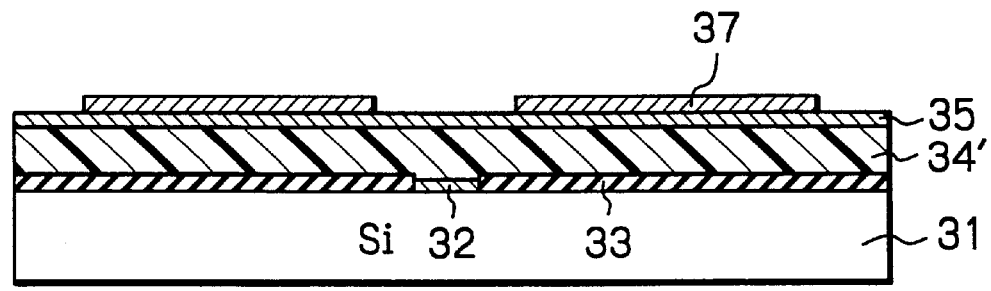

Next, referring to FIG. 13F, in the same way as in FIG. 6F, the photoresist pattern layer 36 is removed. The Au layer 37 serves as lands for metal bumps.

Figure 13G:
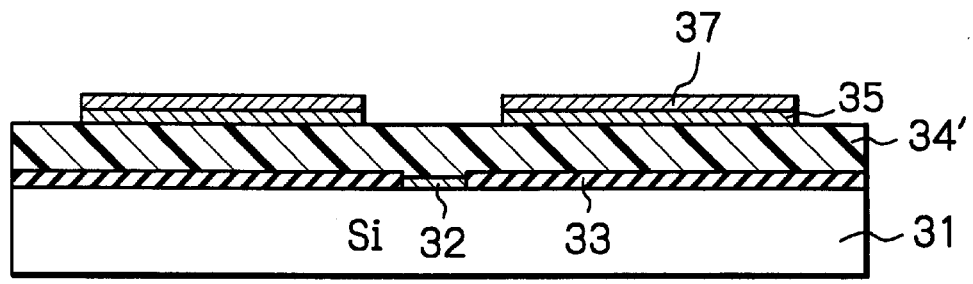

Next, referring to FIG. 13G, in the same way as in FIG. 6G, the Cu layer 35 is etched by a wet etching process using ferric chloride or sulfuric acid and the Au layer 37 as a mask.

Figure 13H:
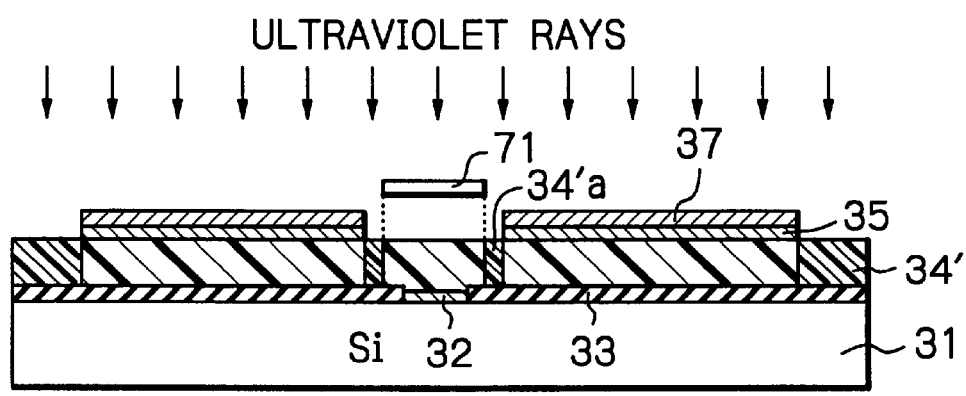

Next, referring to FIG. 13H, the device is exposed to ultraviolet rays from a mercury lamp using an exposure mask 71 corresponding to the pad electrode 32. As a result, if the photosensitive insulating stress-absorbing resin layer 34' is negative, the exposed portions 34'a thereof are hardened.

Figure 13I:
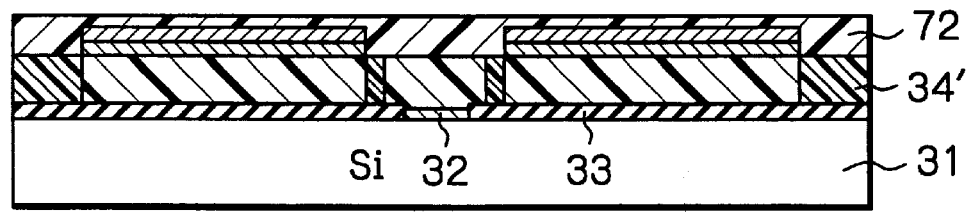

Next, referring to FIG. 13I, a solder resist layer 72 is coated on the entire surface.

Next, referring to FIG. 13J, the device is exposed to ultraviolet rays from a mercury lamp using an exposure mask 73 corresponding to the pad electrode 32 and a metal bump which will be formed later. As a result, if the solder resist layer 72 is negative, the exposed portions 72a thereof are hardened.

Figure 13J:
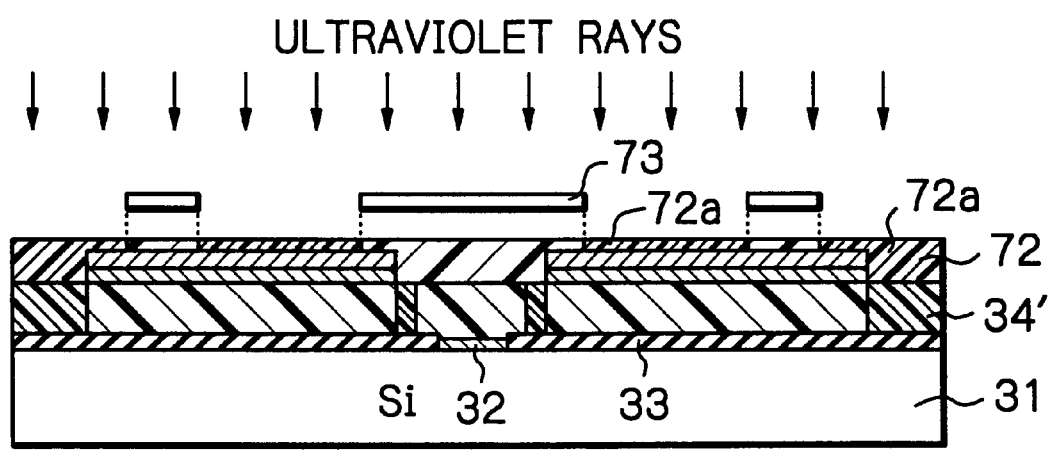
Figure 13K:
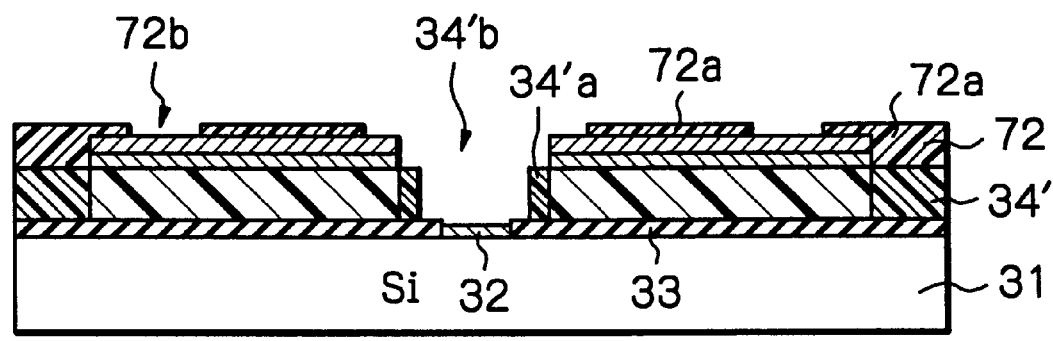

Next, referring to FIG. 13K, the device is subjected to a developing process, i.e., a chemical etching process using tetraethyl ammonium hydroxide (TMAH) solution. As a result, the unexposed portion of the photosensitive insulating stress-absorbing resin layer 34' and the unexposed portion of the solder resist layer 72 are simultaneously removed. Thus, an opening 34'b is perforated in the photosensitive insulating stress-absorbing resin layer 34', and an opening 72b is perforated in the solder resist layer 72. Then, a high-temperature curing operation is performed upon the device to react the thermosetting components of the photosensitive insulating stress-absorbing resin layer 34' and the solder resist layer 72.

Figure 13L:
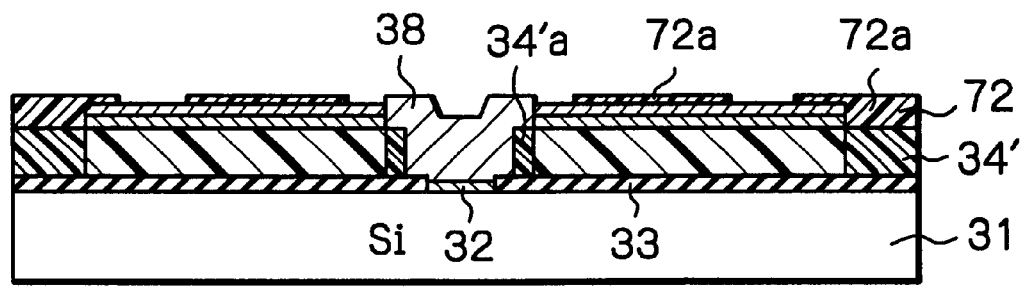

Next, referring to FIG. 13L, in the same way as in FIG. 6K, a flexible conductive layer 38 is coated by a screen printing method or a potting method, so that the flexible conductive layer 38 is filled only in the openings 34'a, thus preventing the pad electrode 32 from being oxidized. As a result, the Cu layer 35 and the Au layer 37 are electrically connected to the corresponding pad electrode 32 via the flexible conductive layer 38. The flexible conductive layer 16 is made of powdered material of at least one of copper (Cu), lead (Pb), tin (Sn), nickel (Ni), palladium (Pd), silver (Ag) or gold (Au), that shows excellent solder-wettability characteristics as well as excellent flexibility characteristics.

Figure 13M:
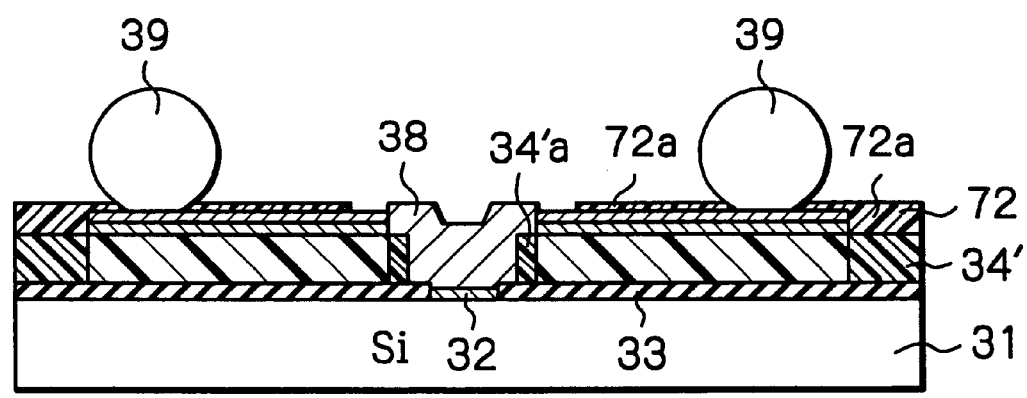

Referring to FIG. 13M, in the same way as in FIG. 6L, metal bumps 39 are soldered to the Au layer 37 and a heating reflowing process is performed thereupon. Even in this case, the metal bumps 39 can be securely adhered to the Au layer 37.

Finally, the device is cut by a dicing blade (not shown) to separate flip-chip type semiconductor chips (pellets) from each other.

In the fifth embodiments as illustrated in FIGS. 13A through 13M, since the steps as illustrated in FIGS. 6H and 6I are unnecessary, the manufacturing steps can be simplified.

In the fifth embodiment, the steps of FIGS. 6B and 6C can be used instead of the steps of FIGS. 13B and 13C. Also, the conductive wiring 51 of FIGS. 11A through 11E or the conductive layer 61 of FIGS. 12A through 12E can be used instead of the conductive layer 38.

A sixth embodiment of the method for manufacturing a flip-chip type semiconductor device according to the present invention will be explained next with reference to FIGS. 14A through 14N.

Figure 14A:
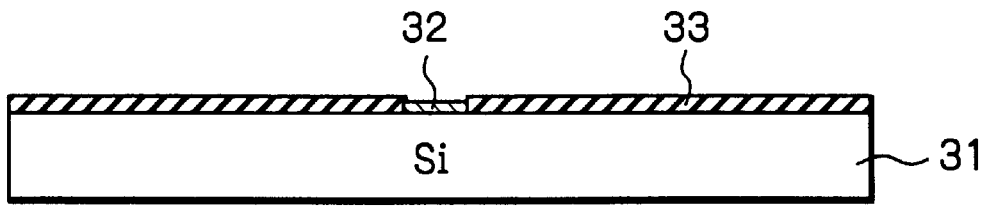
FIGS. 14A through 14Q are cross-sectional views for explaining a sixth embodiment of the method for manufacturing a flip-chip type semiconductor device according to the present invention.

First, referring to FIG. 14A, in the same way as in FIG. 8A, a pad electrode 32 made of aluminum (Al) or copper (Cu) are formed on a silicon substrate 31. Then, a passivation layer 33 made of non-organic material such as silicon oxide ($SiO_2$) or organic material such as polyimide is deposited on the silicon substrate 31 to protect active areas thereof.

Figure 14B:
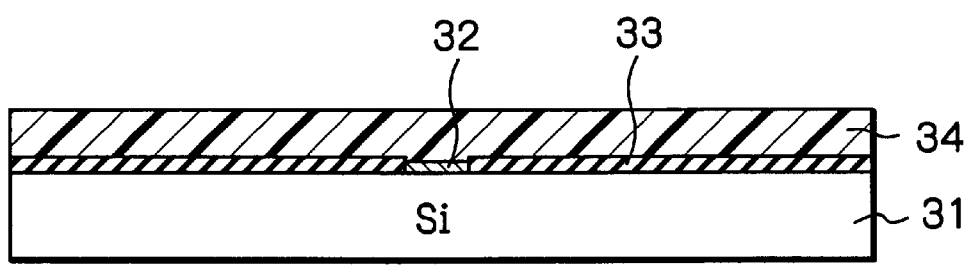

Next, referring to FIG. 14B, in the same way as in FIG. 8B, an insulating stress-absorbing resin layer 34 made of thermosetting resin such as epoxy resin, silicone resin, polyimide resin, polyolefin resin, cyanate-ester resin, phenol resin, naphthalene resin or fluorene resin is coated on the entire surface by a spin-coating process. Note that the modulus of elasticity of the insulating stress-absorbing resin layer 34 is approximately from 0.01 to 8 GPa.

Figure 14C:
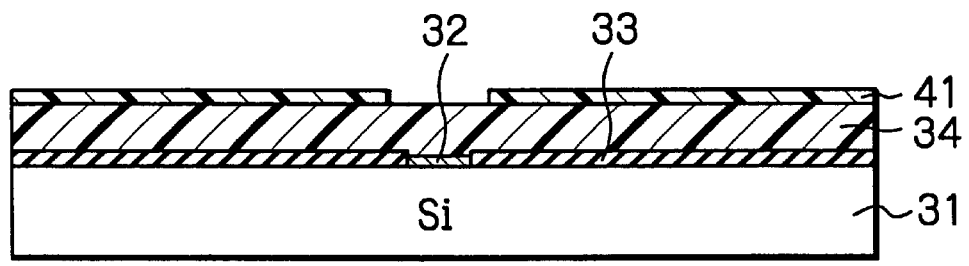

Next, referring to FIG. 14C, in the same way as in FIG. 8C, a photoresist pattern layer 41, which has a opening corresponding to the pad electrode 32, is formed by a photolithography process.

Figure 14D:
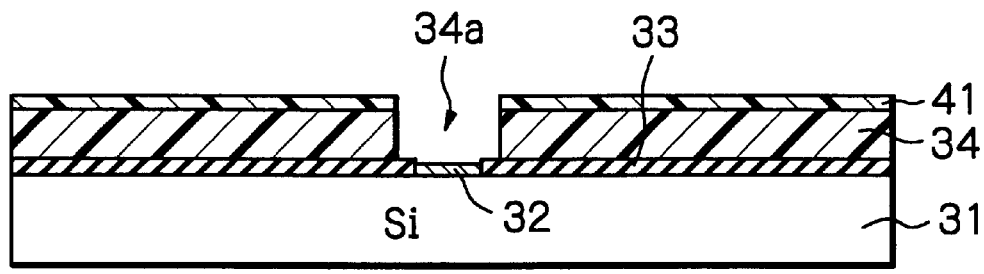

Next, referring to FIG. 14D, in the same way as in FIG. 8D, the insulating stress-absorbing resin layer 34 is etched by using the photoresist pattern layer 41 as a mask. As a result, an opening 34a corresponding to the pad electrode 32 is perforated in the insulating stress-absorbing resin layer 34.

Figure 14E:
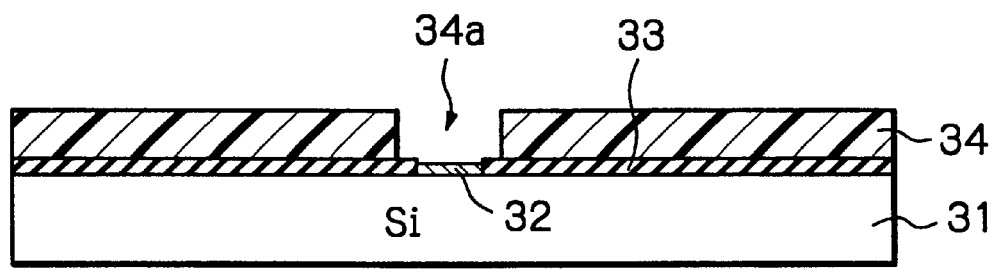

Next, referring to FIG. 14E, in the same way as in FIG. 8E, the photoresist pattern layer 41 is removed.

Note that, if the insulating stress-absorbing resin layer 34 is photosensitive, the steps of FIGS. 14C, 14D and 14E are replaced by an ultraviolet exposing and developing process.

Figure 14F:
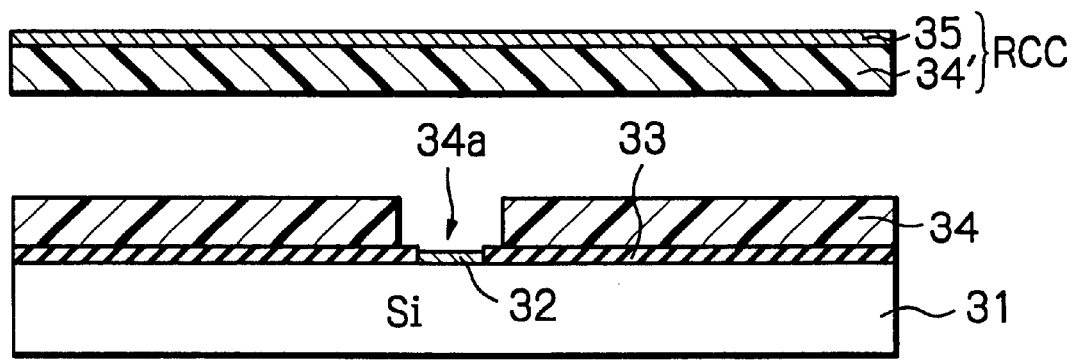

Next, referring to FIG. 14F, in the same way as in FIG. 13B, an (RCC) layer consisting of a photosensitive insulating stress-absorbing resin layer 34' laminated by a Cu layer 35 is prepared.

Figure 14G:
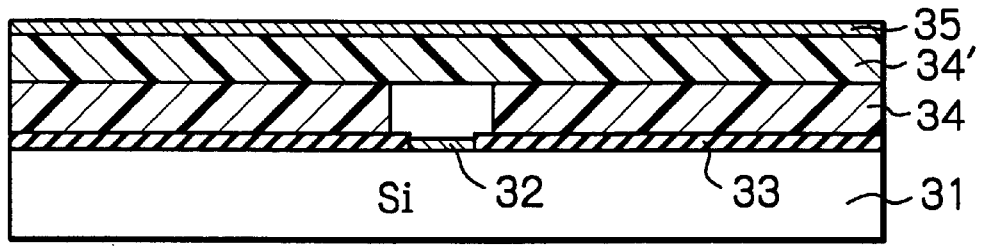

Next, referring to FIG. 14G, in the same way as in FIG. 13C, the RCC layer (34', 35) is adhered to the pad electrode 32 and the passivation layer 33 by a film laminating method or a pressing method. In this case, since the RCC layer (34', 35) has good adhesive characteristics the RCC layer (34', 35) per se can be easily adhered to the pad electrode 32 and the passivation layer 33.

Figure 14H:
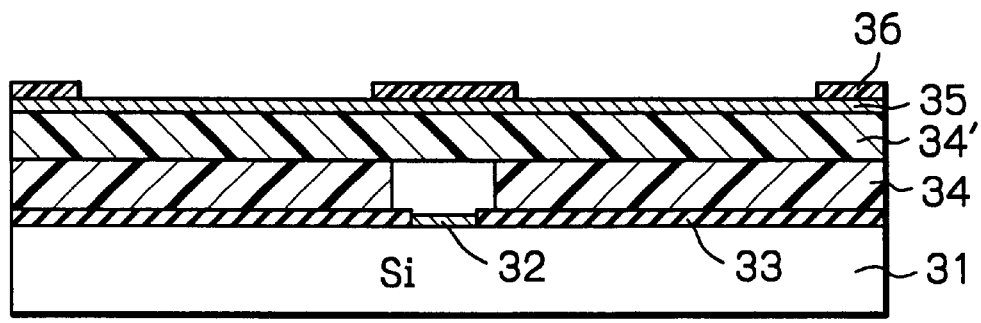

Next, referring to FIG. 14H, in the same way as in FIG. 13D, a photoresist layer is coated on the entire surface, and then, the photoresist layer is patterned by a photolithography process to form a photoresist pattern layer 36.

Figure 14I:
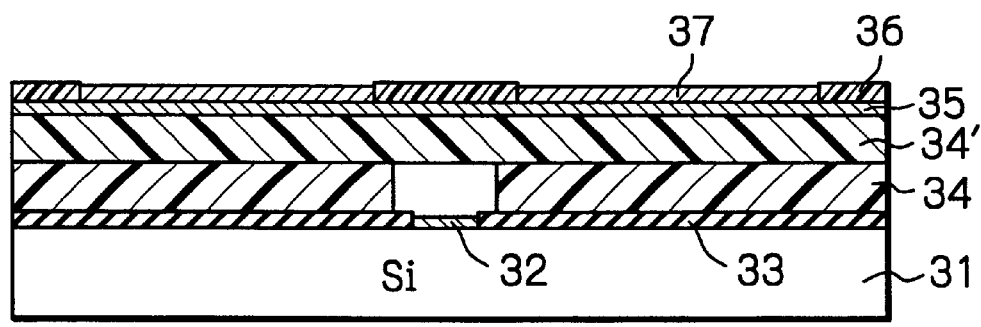

Next, referring to FIG. 14I, in the same way as in FIG. 13E, an Au plating layer 37 is formed on the Cu layer 35 through the photoresist pattern layer 36.

Note that other metal such as nickel can be used for the layer 37.

Figure 14J:
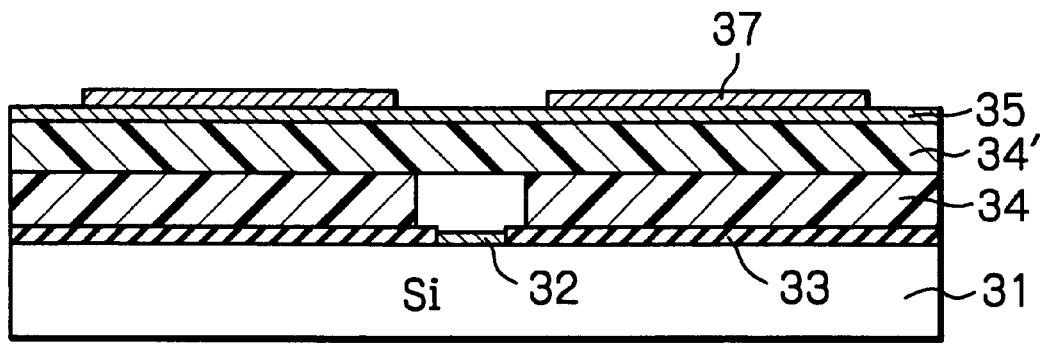

Next, referring to FIG. 14J, in the same way as in FIG. 13F, the photoresist pattern layer 36 is removed. The Au layer 37 serves as lands for metal bumps.

Figure 14K:
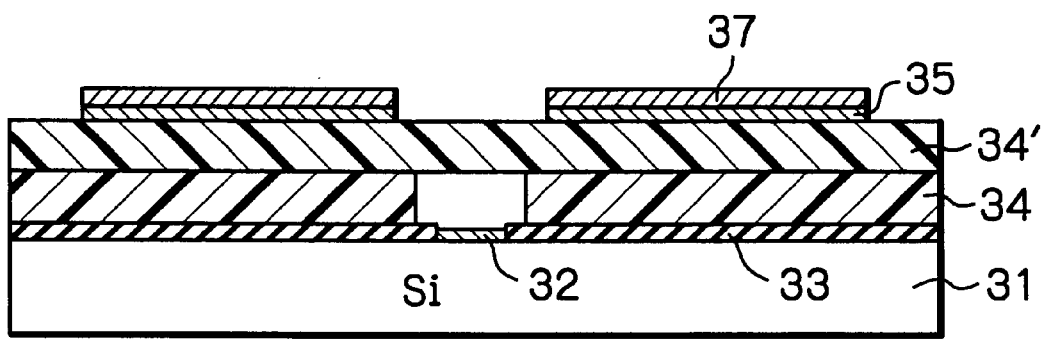

Next, referring to FIG. 14K, in the same way as in FIG. 13G, the Cu layer 35 is etched by a wet etching process using ferric chloride or sulfuric acid and the Au layer 37 as a mask.

Figure 14L:
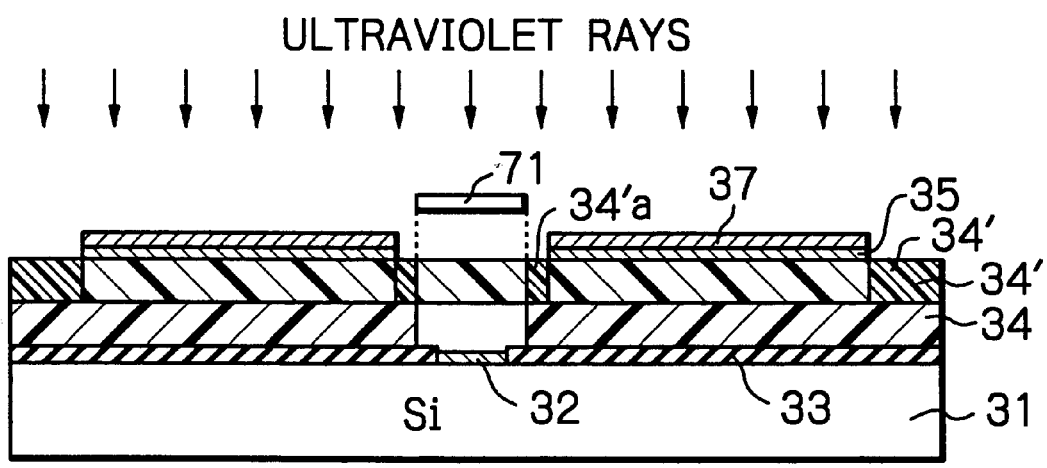

Next, referring to FIG. 14L, in the same way as in FIG. 13H, the device is exposed to ultraviolet rays from a mercury lamp using an exposure mask 71 corresponding to the pad electrode 32. As a result, if the photosensitive insulating stress-absorbing resin layer 34' is negative, the exposed portions 34'a thereof are hardened.

Figure 14M:
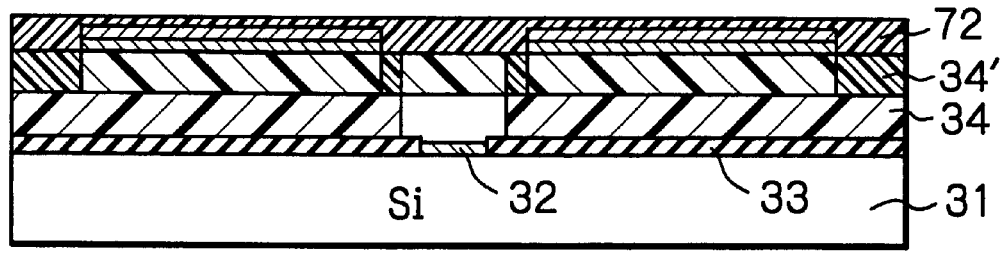
Figure 14N:
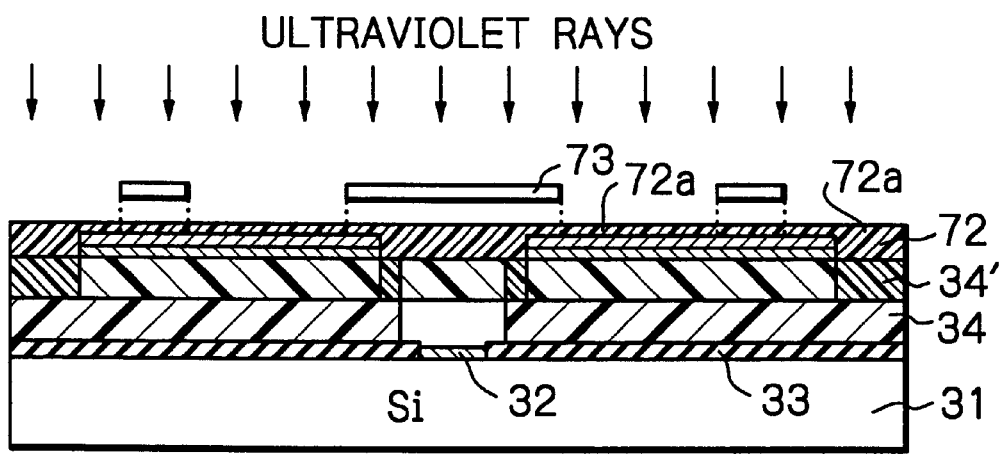

Next, referring to FIG. 14M, in the same way as in FIG. 13I, a solder resist layer 72 is coated on the entire surface.

Next, referring to FIG. 14N, in the same way as in FIG. 13I, the device is exposed to ultraviolet rays from a mercury lamp using an exposure mask 73 corresponding to the pad electrode 32 and a metal bump which will be formed later. As a result, if the solder resist layer 72 is negative, the exposed portions 72a thereof are hardened.

Figure 14O:
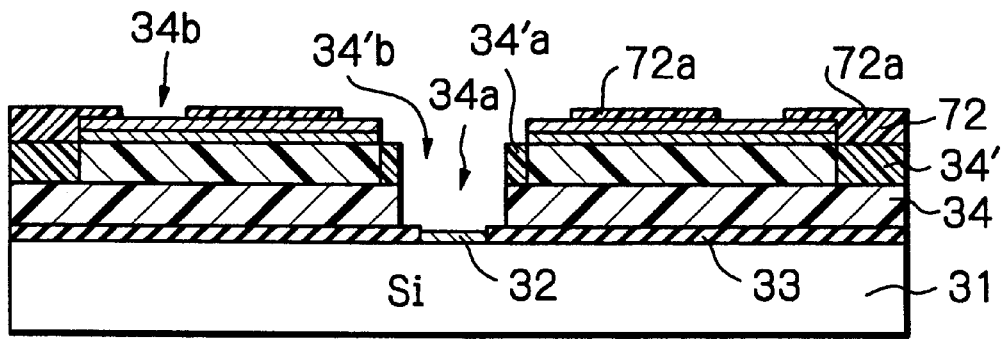

Next, referring to FIG. 14O, in the same way as in FIG. 13J, the device is subjected to a developing process, i.e., a chemical etching process using TMAH solution. As a result, the unexposed portion of the photosensitive insulating stress-absorbing resin layer 34' and the unexposed portion of the solder resist layer 72 are simultaneously removed. Thus, an opening 34'b leading to the opening 34a is perforated in the photosensitive insulating stress-absorbing resin layer 34', and an opening 72b is perforted in the solder resist layer 72. Then, a high-temperature curing operation is performed upon the device to react the thermosetting components of the photosensitive insulating stress-absorbing resin layer 34' and the solder resist layer 72.

Figure 14P:
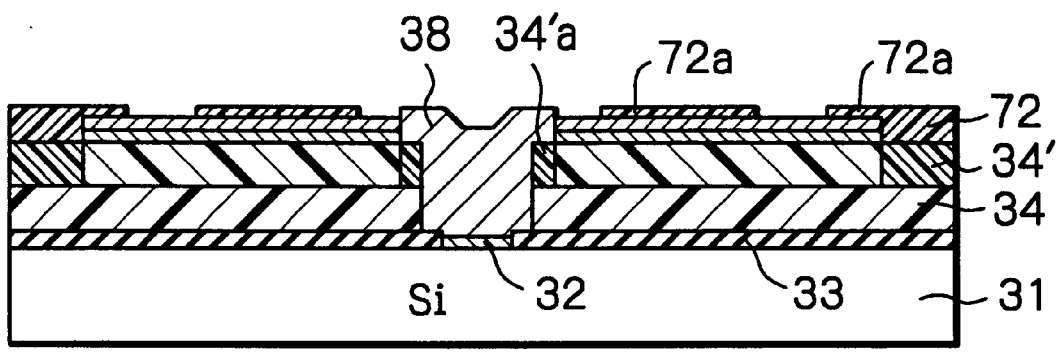

Next, referring to FIG. 14P, in the same way as in FIG. 13K, a flexible conductive layer 38 is coated by a screen printing method or a potting method, so that the flexible conductive layer 38 is filled only in the opening 34'b as well as in the opening 34a, thus preventing the pad electrode 32 from being oxidized. As a result, the Cu layer 35 and the Au layer 37 are electrically connected to the corresponding pad electrode 32 via the flexible conductive layer 38. The flexible conductive layer 16 is made of powdered material of at least one of copper (Cu), lead (Pb), tin (Sn), nickel (Ni), palladium (Pd), silver (Ag) or gold (Au), that shows excellent solder-wettability characteristics as well as excellent flexibility characteristics.

Figure 14Q:
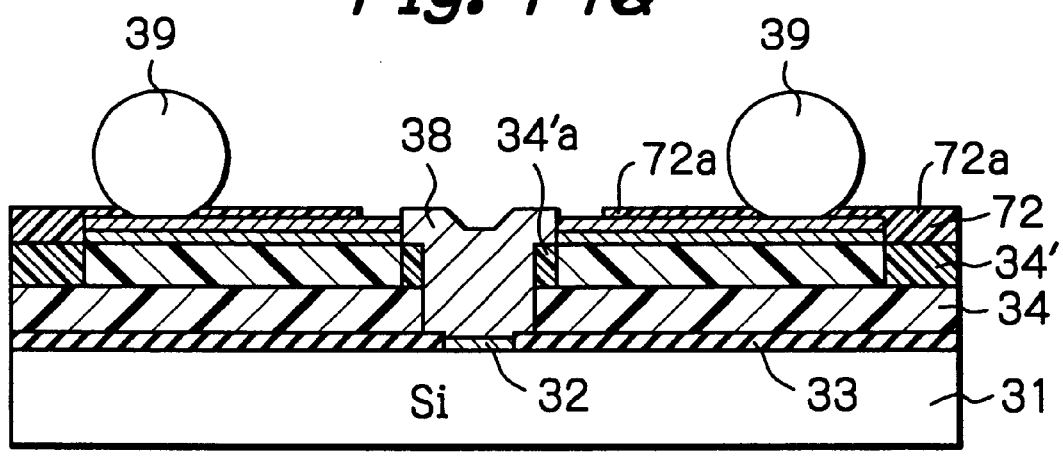

Referring to FIG. 14Q, in the same way as in FIG. 13L, metal bumps 39 are soldered to the Au layer 37 and a heating reflowing process is performed thereupon. Even in this case, the metal bump 39 can be securely adhered to the Au layer 37.

Note that the metal bump 39 can be made of Au or Sn—Ag alloy.

Finally, the device is cut by a dicing blade (not shown) to separate flip-chip type semiconductor chips (pellets) from each other.

In the sixth embodiments as illustrated in FIGS. 14A through 14L, since the insulating stress-absorbing resin layer (34, 34') is much thicker than the insulating stress-absorbing resin layer 34' in the fifth embodiment, the stress strain due to the discrepancy in thermal expansion coefficient between the device and a motherboard or the like can be remarkably reduced.

As explained hereinabove, according to the present invention, since an elastic layer for reducing the stress stress strain due to the discrepancy in thermal expansion coefficient is made of thermosetting resin with little contamination, the reliability of flip-chip type semiconductor devices can be improved.

What is claimed is:

1. A method for manufacturing a flip-chip type semiconductor device, comprising the steps of:

forming a plurality of pad electrodes on a semiconductor substrate;

adhering a resin-coated conductive layer on said semiconductor substrate, said resin-coated conductive layer comprising a photosensitive insulating stress-absorbing resin layer made of thermosetting resin laminated with a first conductive layer;

forming a second conductive layer having a pattern on said first conductive layer;

perforating said first conductive layer by using said second conductive layer as a mask, so that said first and second conductive layers have openings;

irradiating said photosensitive insulating stress-absorbing resin layer with light by using an exposure mask and said patterned first and second conductive layers as masks so that irradiated portions of said photosensitive insulating stress-absorbing resin layer are hardened;

developing said photosensitive insulating stress-absorbing resin layer so that non-irradiated portions of said photosensitive insulating stress-absorbing resin layer are removed, so that said photosensitive insulating stress-absorbing resin layer has openings corresponding to said pad electrodes;

forming flexible conductive members each filled in one of said openings in said photosensitive insulating stress-absorbing layer and electrically connecting said first and second conductive layers to said pad electrodes; and forming a plurality of metal bumps on said second conductive layer.

2. The method as set forth in claim 1, further comprising the steps of:

coating a photosensitive solder resist layer on said second conductive layer after said photosensitive insulating stress-absorbing resin layer is irradiated; and irradiating said photosensitive solder resist layer with light by using an exposure mask, developing said photosensitive solder resist layer so that non-irradiated portions of said photosensitive solder resist layer are removed, so that said metal bumps are formed where said photosensitive solder resist layer is removed.

3. The method as set forth in claim 2, wherein said thermosetting resin is one of epoxy resin, silicone resin, polyimide resin, polyolefin resin, cyanate-ester resin, phenol resin, naphthalene resin and fluorene resin combined with a photosensitive material.

4. The method as set forth in claim 1, wherein said flexible conductive members are made of powdered material including at least one of Cu, Pb, Sn, Ni, Pd, Ag and Au.

5. The method as set forth in claim 1, further comprising a step of forming a plurality of conductive wires each included in each one of said flexible conductive members.

6. The method as set forth in claim 1, wherein each of said flexible conductive members comprises a bonding wire.

7. The method as set forth in claim 1, wherein each of said flexible conductive members comprises an electroless plating layer.

* * * * *

UNITED STATES PATENT AND TRADEMARK OFFICE
CERTIFICATE OF CORRECTION

PATENT NO.    : 6,696,317 B1
DATED         : February 24, 2004
INVENTOR(S)   : Hirokazu Honda It is certified that error appears in the above-identified patent and that said Letters Patent is hereby corrected as shown below:

Title page,
Item [*] Notice, delete the phrase "by 94 days" and insert -- by 87 days --

Signed and Sealed this

Fifth Day of October, 2004

JON W. DUDAS
*Director of the United States Patent and Trademark Office*